(12) United States Patent
Tanaka

(10) Patent No.: US 11,223,435 B2
(45) Date of Patent: Jan. 11, 2022

(54) SERIAL DATA TRANSMISSION DEVICE AND CLOCK RECOVERY DEVICE

(71) Applicant: Sony Semiconductor Solutions Corporation, Kanagawa (JP)

(72) Inventor: Tomokazu Tanaka, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/768,381

(22) PCT Filed: Oct. 18, 2018

(86) PCT No.: PCT/JP2018/038860
§ 371 (c)(1),
(2) Date: May 29, 2020

(87) PCT Pub. No.: WO2019/111554
PCT Pub. Date: Jun. 13, 2019

(65) Prior Publication Data
US 2020/0389243 A1 Dec. 10, 2020

(30) Foreign Application Priority Data
Dec. 5, 2017 (JP) .............................. JP2017-233726

(51) Int. Cl.
*H04J 3/06* (2006.01)
*H03L 7/08* (2006.01)
(Continued)

(52) U.S. Cl.
CPC .......... *H04J 3/0623* (2013.01); *H03L 7/0807* (2013.01); *H03L 7/1974* (2013.01);
(Continued)

(58) Field of Classification Search
CPC ....... H04L 25/247; H03L 7/23; H03L 7/0807; H03L 7/093; H03L 7/0991; H03L 7/1974;
(Continued)

(56) References Cited

U.S. PATENT DOCUMENTS

2003/0223409 A1 12/2003 Wiebe
2009/0251225 A1* 10/2009 Chen ....................... H03L 7/093
331/1 A
(Continued)

FOREIGN PATENT DOCUMENTS

JP 50-34714 4/1975
JP 05-167596 A 7/1993
(Continued)

OTHER PUBLICATIONS

Extended European Search Report dated Dec. 16, 2020 for corresponding European Application No. 18887048.9.
(Continued)

*Primary Examiner* — Jung Liu
(74) *Attorney, Agent, or Firm* — Michael Best & Friedrich LLP

(57) ABSTRACT

[Problem to be Solved] To provide a serial data transmission device that makes it possible to dynamically switch a band or a data transmission path and enhance the stability to failure while multiplexing and transmitting data by a TDM method when serial data is transmitted between a plurality of daisy-chained data transmission devices.

[Solution] There is provided a serial data transmission device including: a receiver that receives data serially transmitted by a time-division multiplex method from another device daisy-chained to the serial data transmission device; a transmitter that serially transmits data by the time-division multiplex method to another device daisy-chained to the serial data transmission device; and a controller that controls
(Continued)

serial transmission by the receiver and the transmitter, in which the controller performs control to make the serial transmission by the transmitter adjustable.

11 Claims, 19 Drawing Sheets

(51) Int. Cl.
*H03L 7/197* (2006.01)
*H04J 3/08* (2006.01)
*H04J 3/16* (2006.01)
*H04L 7/033* (2006.01)
*H04L 12/28* (2006.01)

(52) U.S. Cl.
CPC ............... *H04J 3/08* (2013.01); *H04J 3/1605* (2013.01); *H04L 7/0331* (2013.01); *H04L 12/28* (2013.01)

(58) Field of Classification Search
CPC ..... H03L 7/0995; H03L 7/081; H03L 7/0998; H03L 7/183; H03L 2207/50; H04N 21/43635; G09G 5/008; G09G 2370/10; G09G 2370/12; G06F 3/1423; H03K 5/133; H03K 3/03; H03K 2005/00052; H03K 2005/00032
See application file for complete search history.

(56) References Cited

U.S. PATENT DOCUMENTS

| | | | |
|---|---|---|---|
| 2012/0096509 A1* | 4/2012 | Zeng | H04L 25/247 725/127 |
| 2012/0124251 A1* | 5/2012 | Hnatko | G11C 7/106 710/29 |
| 2017/0222790 A1 | 8/2017 | Hooper et al. | |

FOREIGN PATENT DOCUMENTS

| | | |
|---|---|---|
| JP | 09-224043 A | 8/1997 |
| JP | 2005-057409 A | 3/2005 |
| JP | 2005-101803 A | 4/2005 |
| JP | 2009-020905 A | 1/2009 |
| JP | 2015-192392 A | 11/2015 |
| WO | 2014/178314 A1 | 11/2014 |
| WO | 2016/149651 A1 | 9/2016 |

OTHER PUBLICATIONS

Minami T. et al., "A 200 MBIT/S Synchronous Tom Loop Optical LAN Suitable for Multiservice Integration", IEEE Journal on Selected Areas in Communications, IEEE Service Center, Piscataway, US, vol. SAC-03, No. 6, Nov. 1, 1985 (Nov. 1, 1985), pp. 849-858, XP000810108, ISSN: 0733-8716, DOI: 10 1109/JSAC.1985. 1146276.

Unknown: "Digital Phase-Locked Loop Design Using SN54/ 74LS297", Texas Instuments, No. SDLA005B Mar. 1, 1997 (Mar. 1, 1997), pp. 1-19, XP002506890, Retrieved from the Internet:URL:http://focus.ti.com/1it/an/sdla005b/sdla005b.pdf [retrieved on Dec. 4, 2008].

Barrett C, "Fractional/Integer-N PLL Basics", Texas Instruments, Technical Brief SWRA029, Texas Instruments,Aug. 1, 1999 (Aug. 1, 1999), pp. 1-55, XP007918115, abstract—p. 6, last paragraph—p. 7, paragraph 4—p. 31, paragraph 3—p. 39, last paragraph.

* cited by examiner

[ FIG. 1 ]
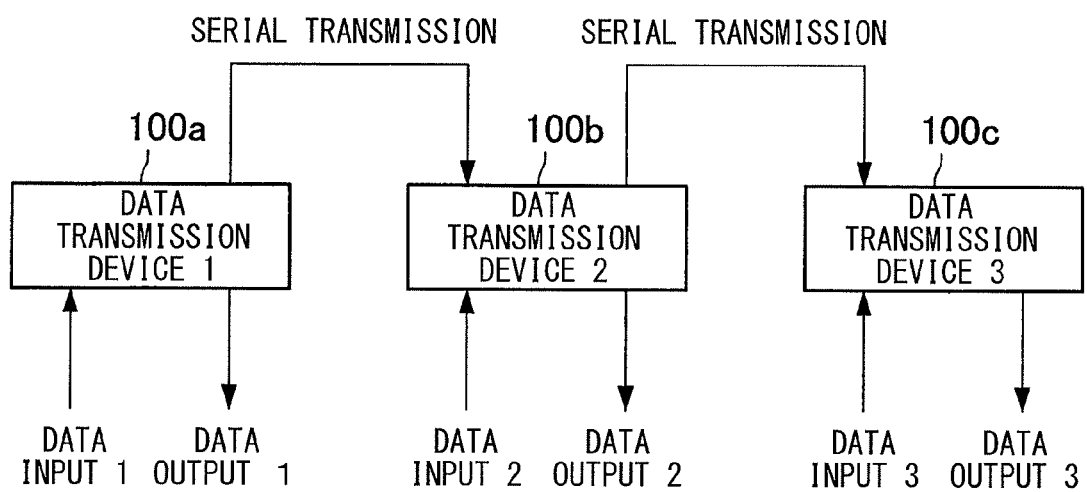

[FIG. 2]
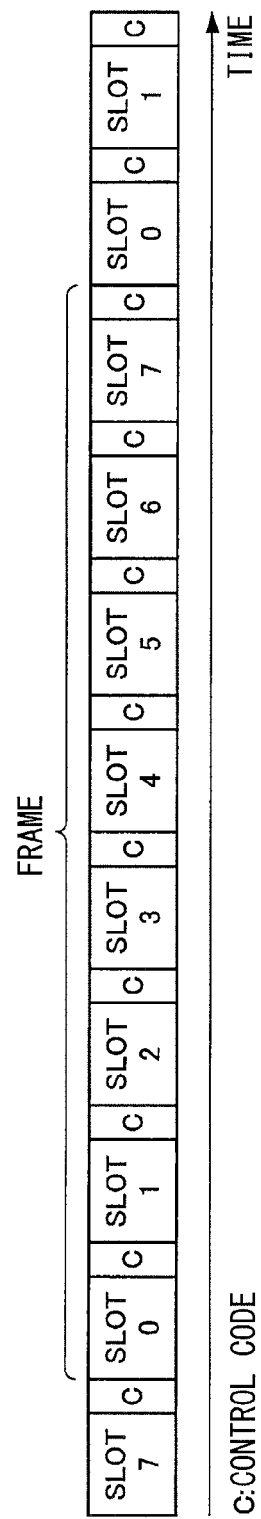

[ FIG. 3 ]
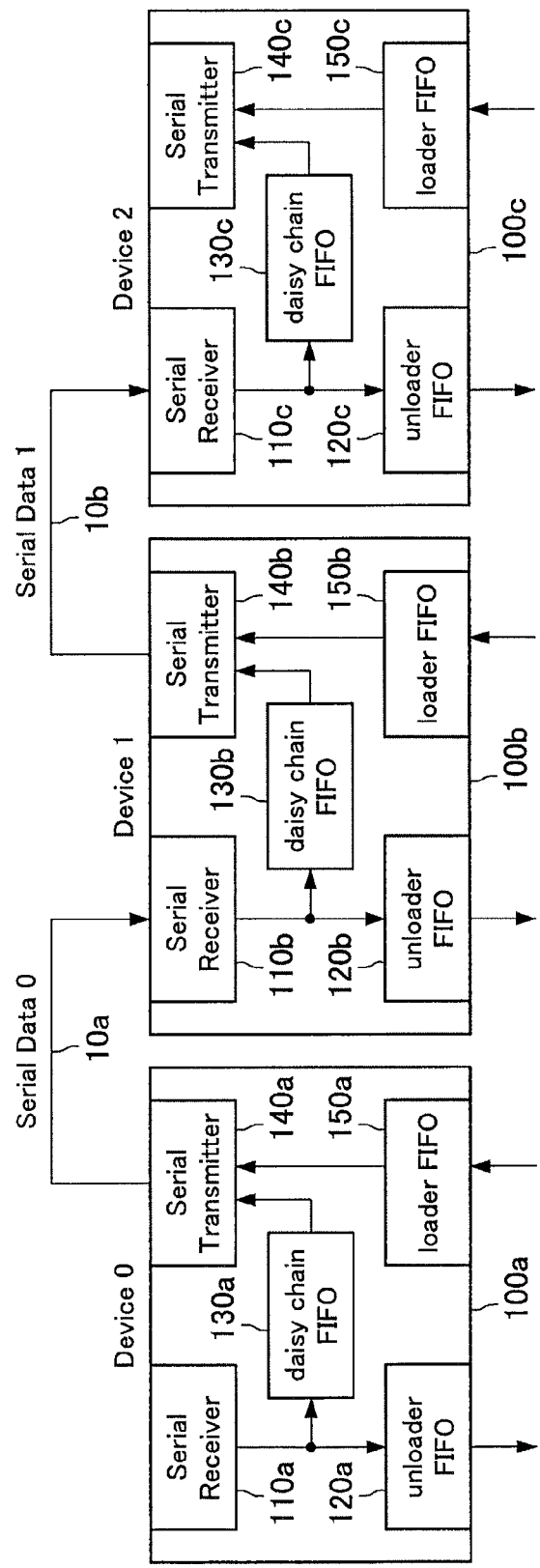

[ FIG. 4 ]
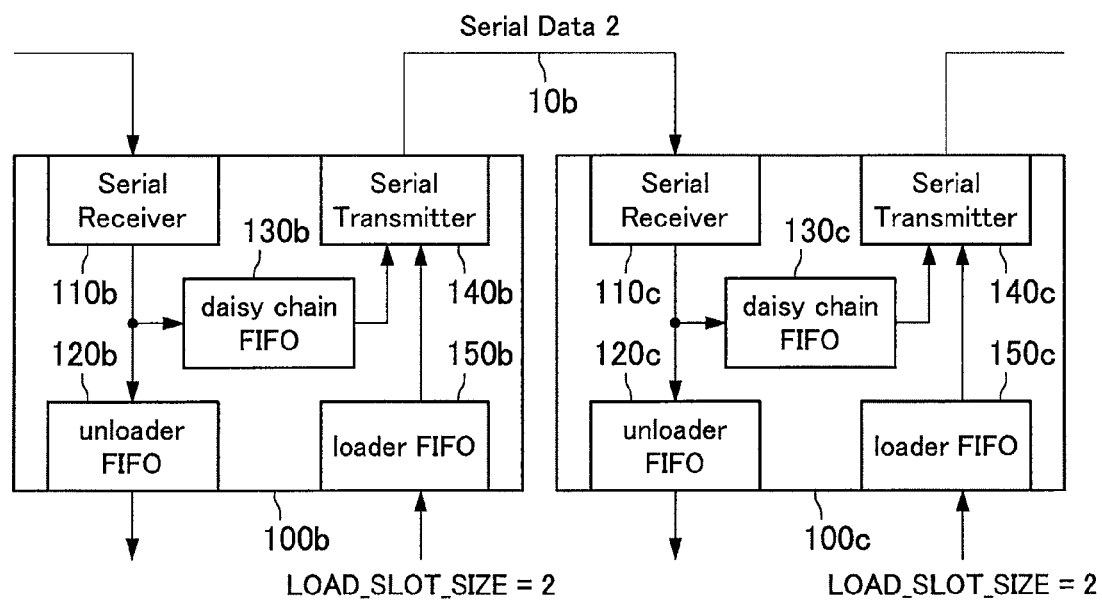

[ FIG. 5 ]
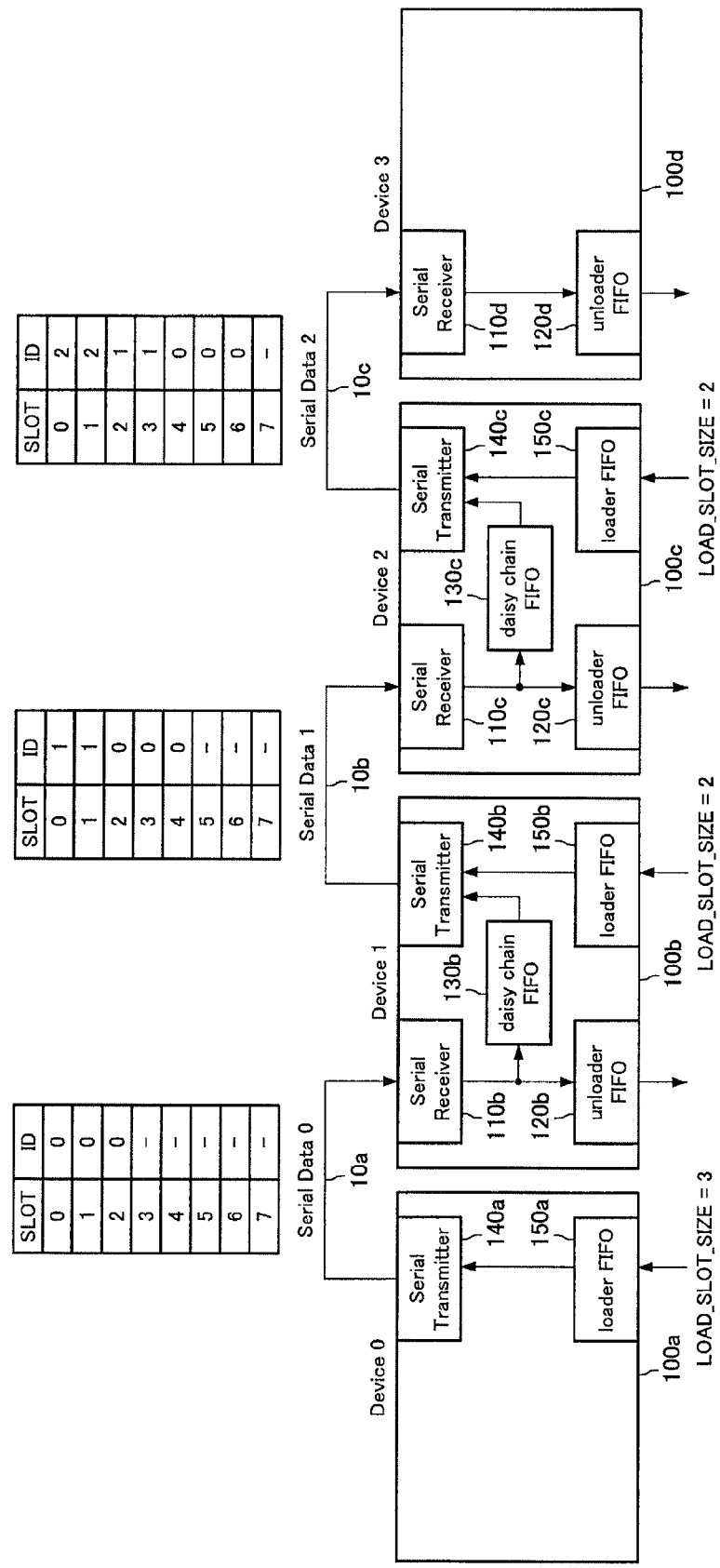

[FIG.6]
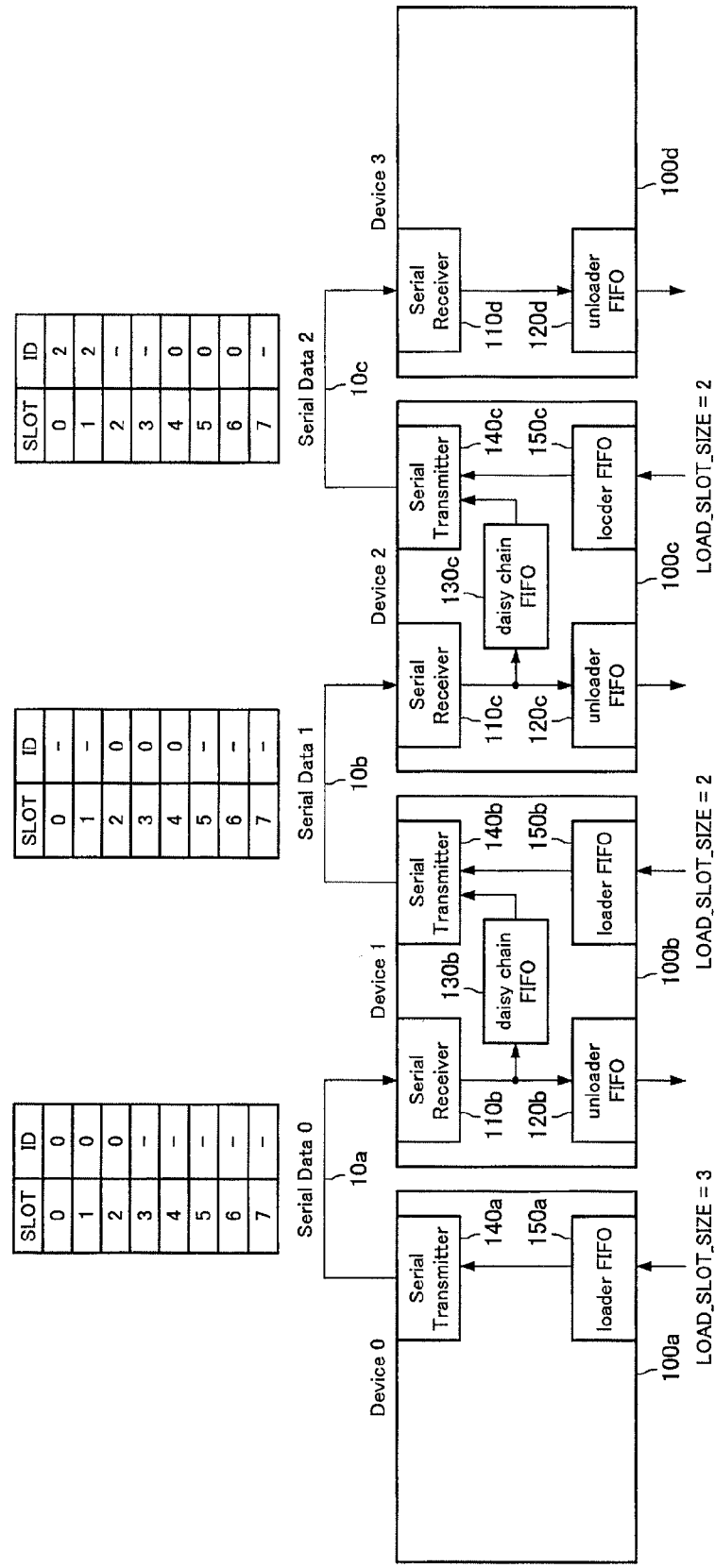

[FIG. 7]
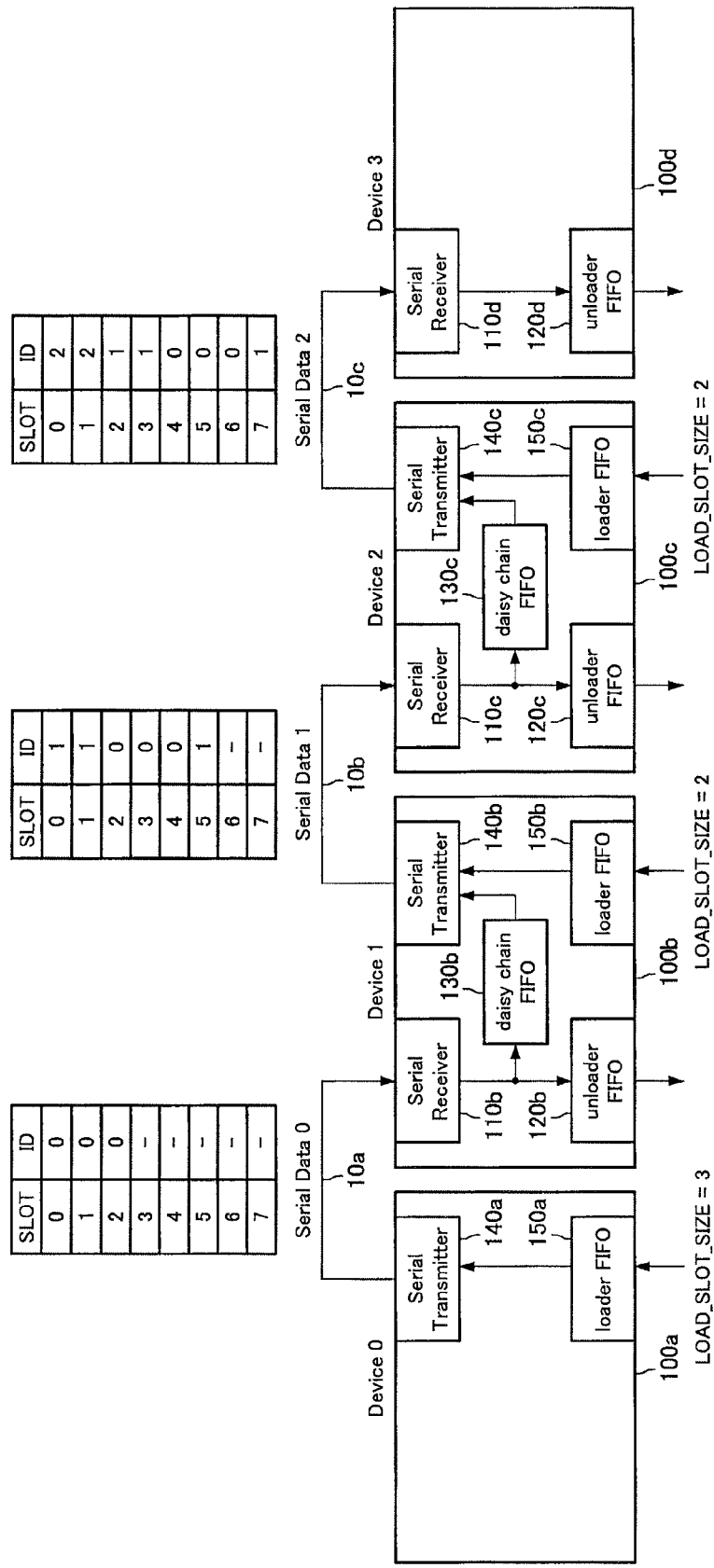

[FIG. 8]
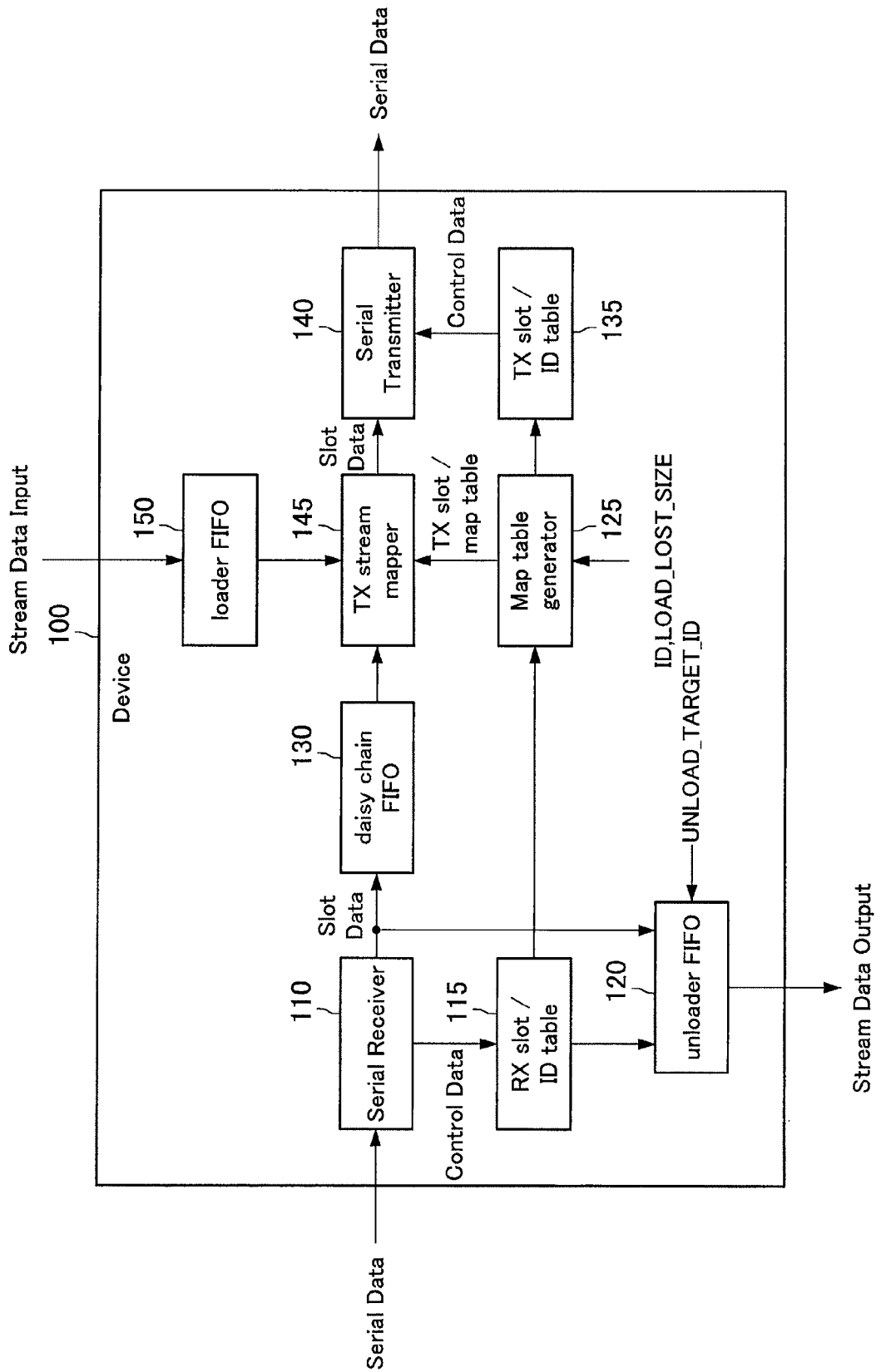

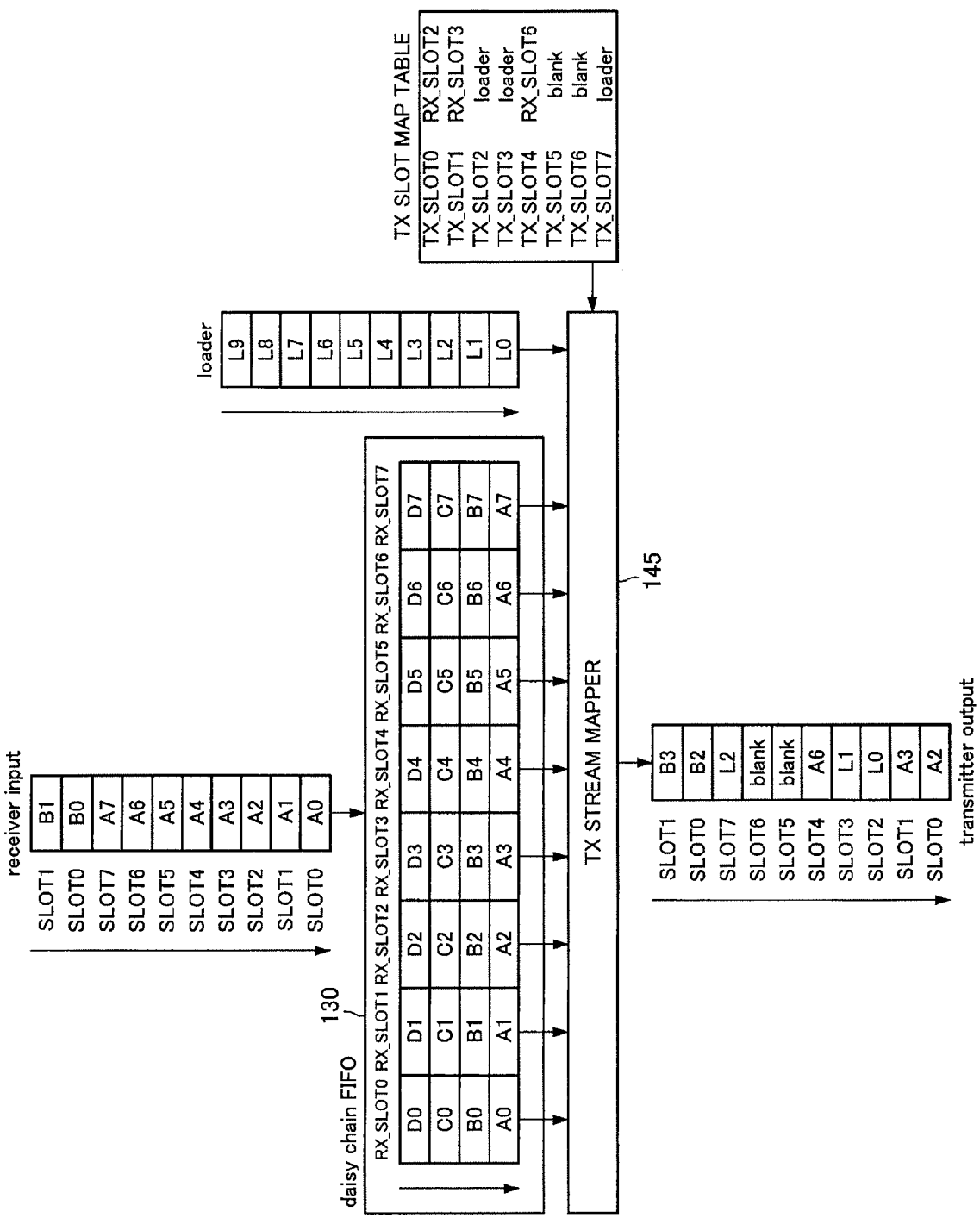
[FIG. 9]

[FIG. 10]
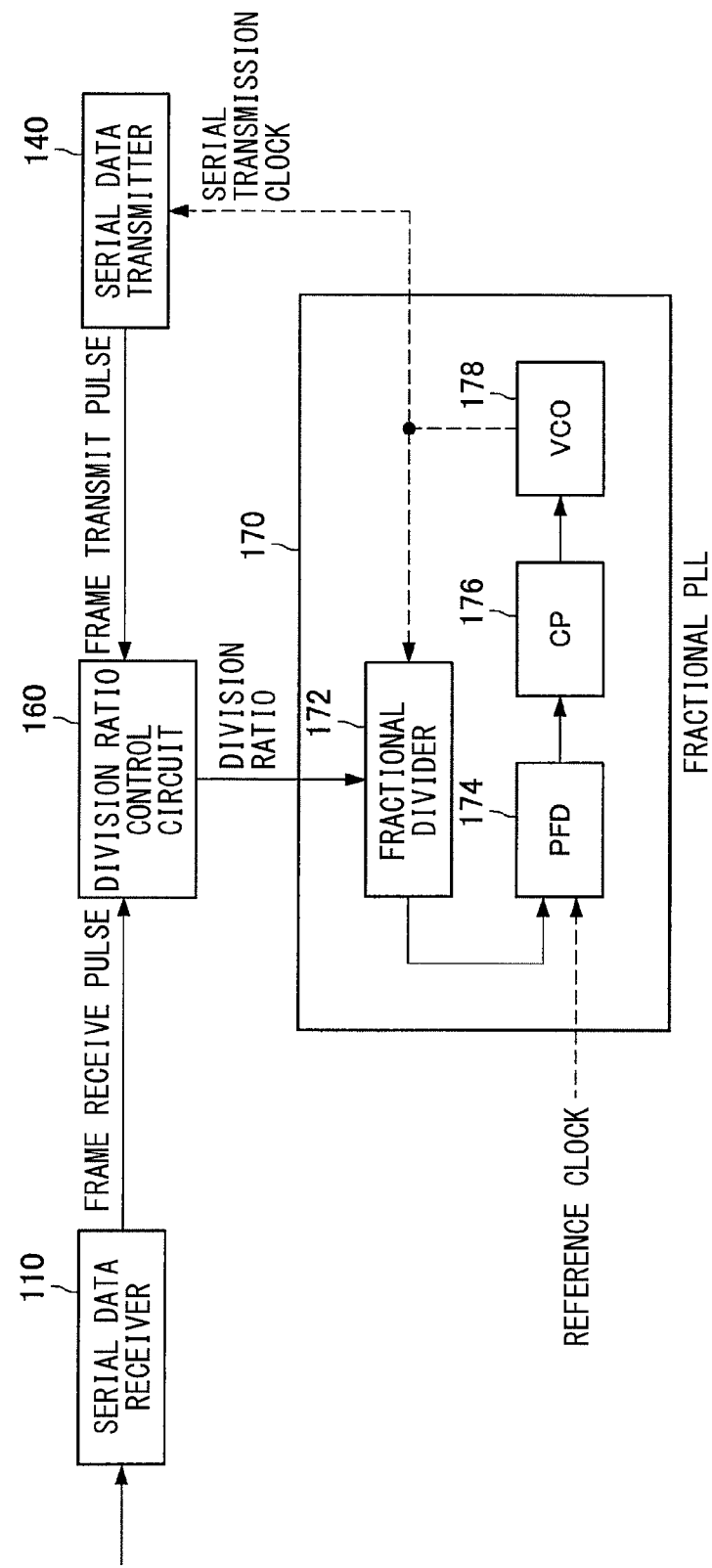

[FIG. 11]
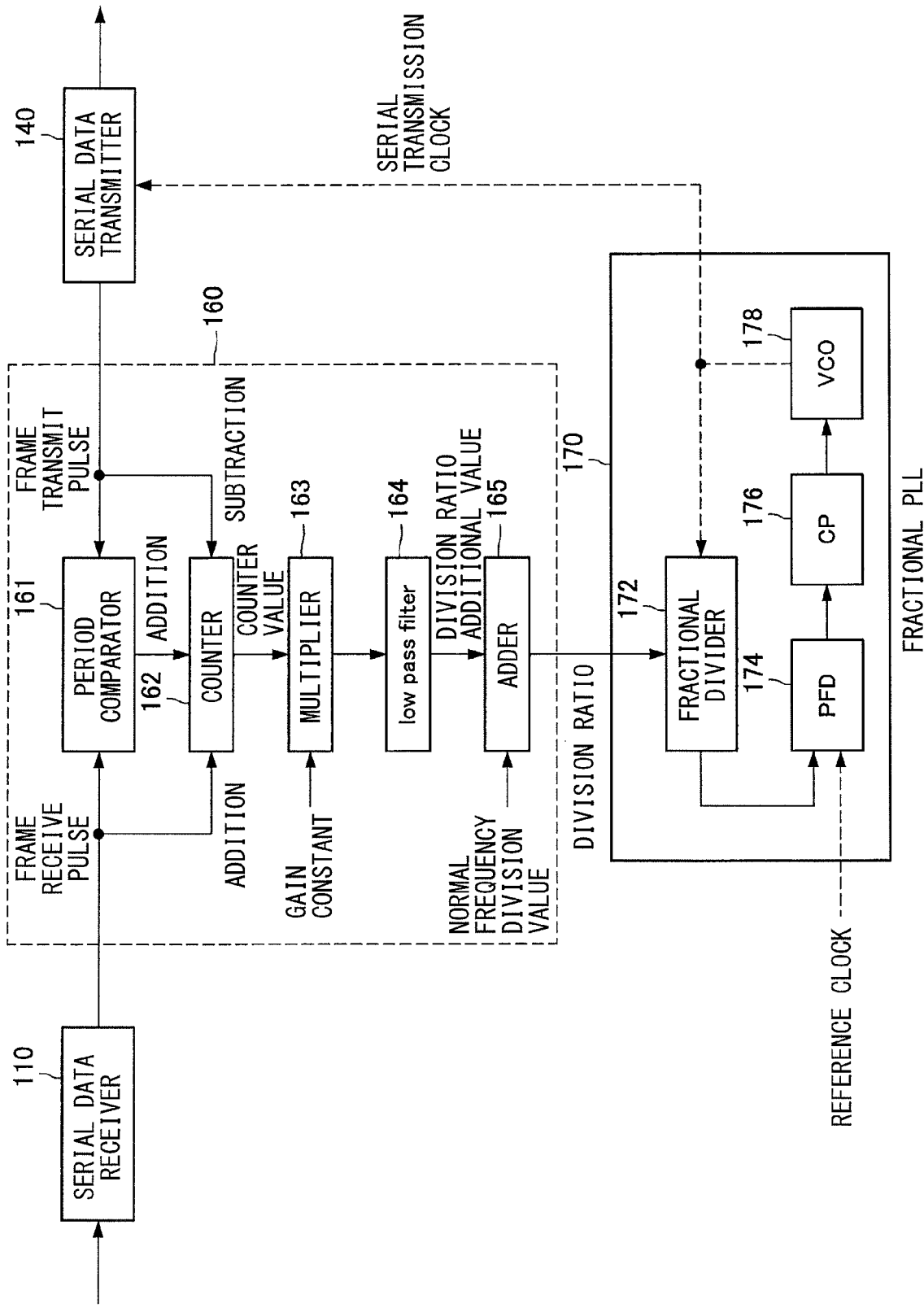

[ FIG. 12 ]
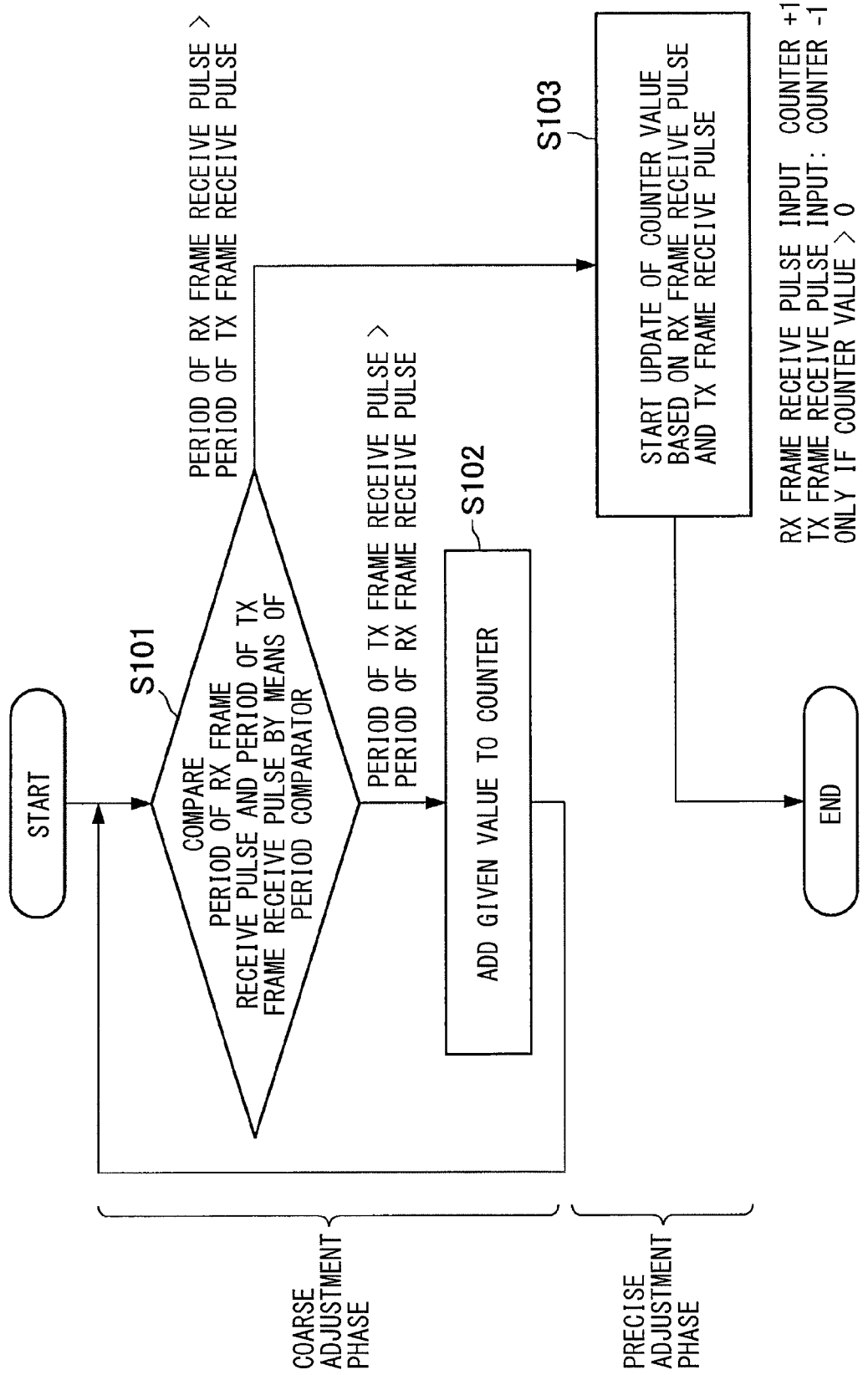

[ FIG. 13 ]
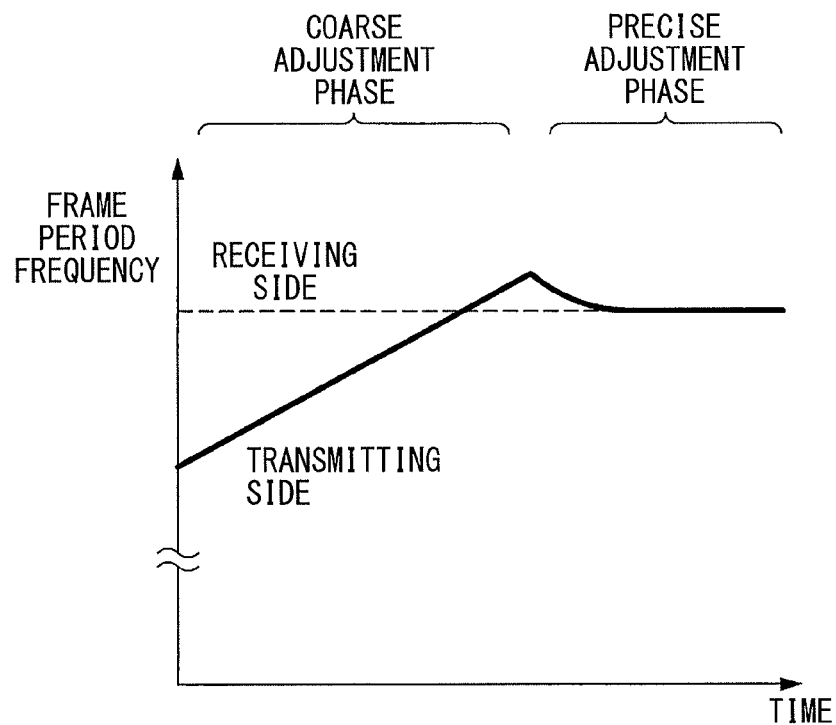
[ FIG. 14 ]
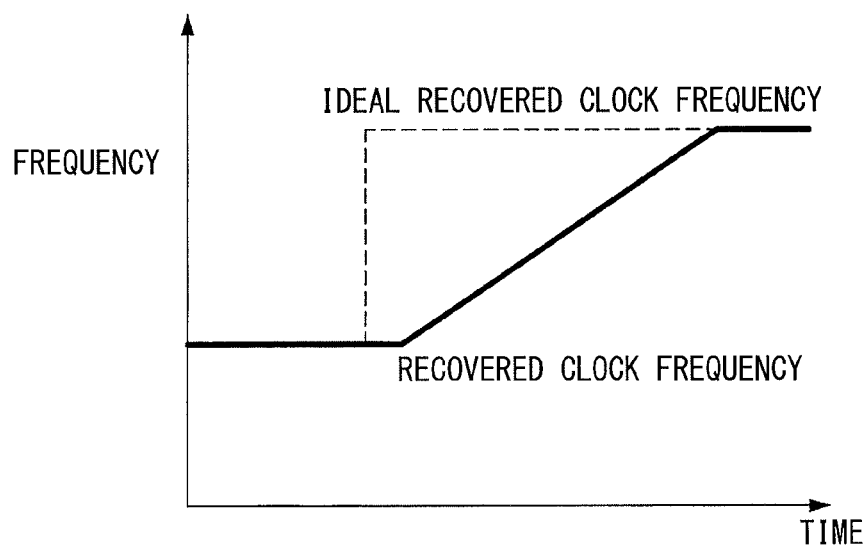

[ FIG. 15 ]
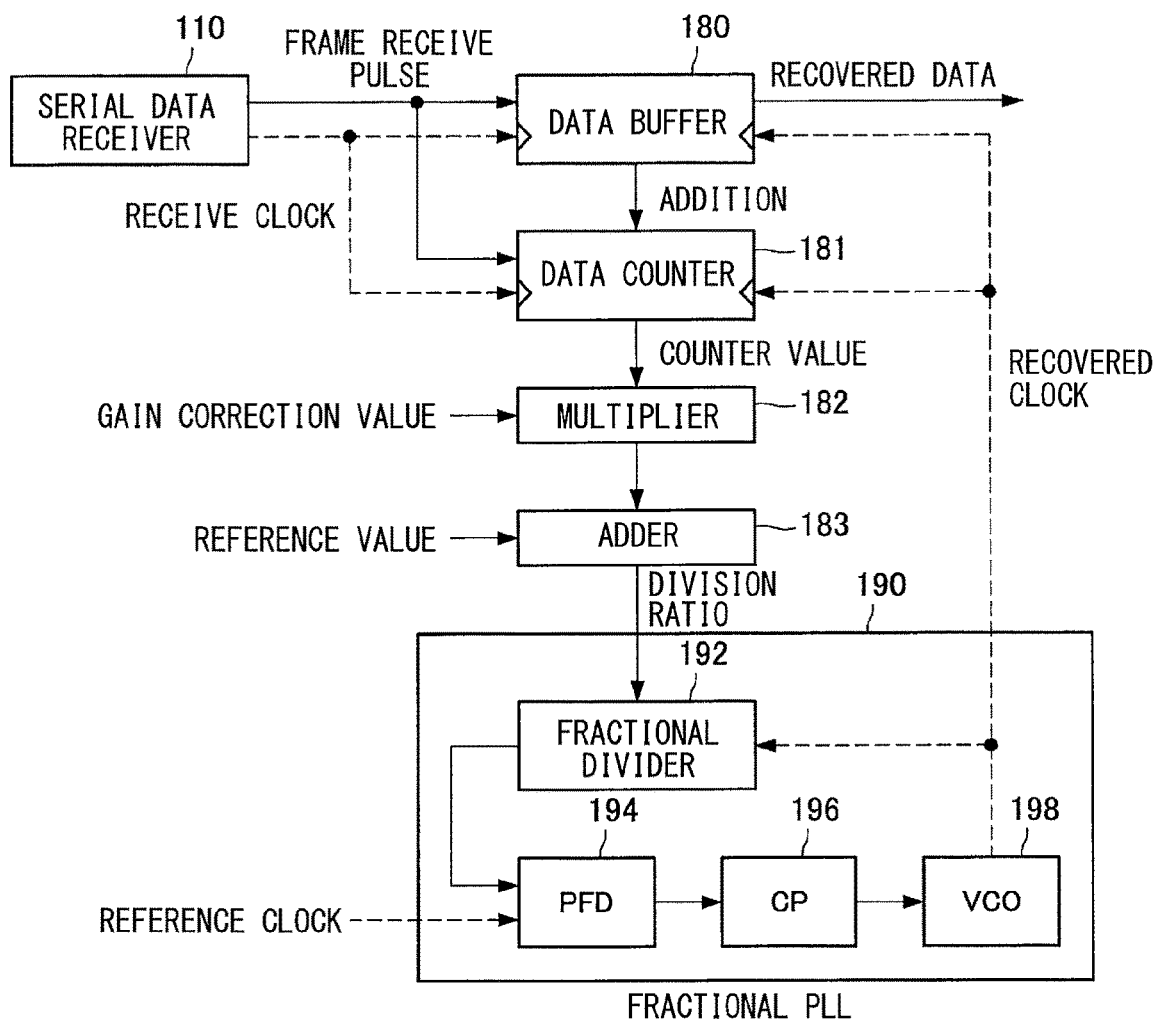

[ FIG. 16 ]
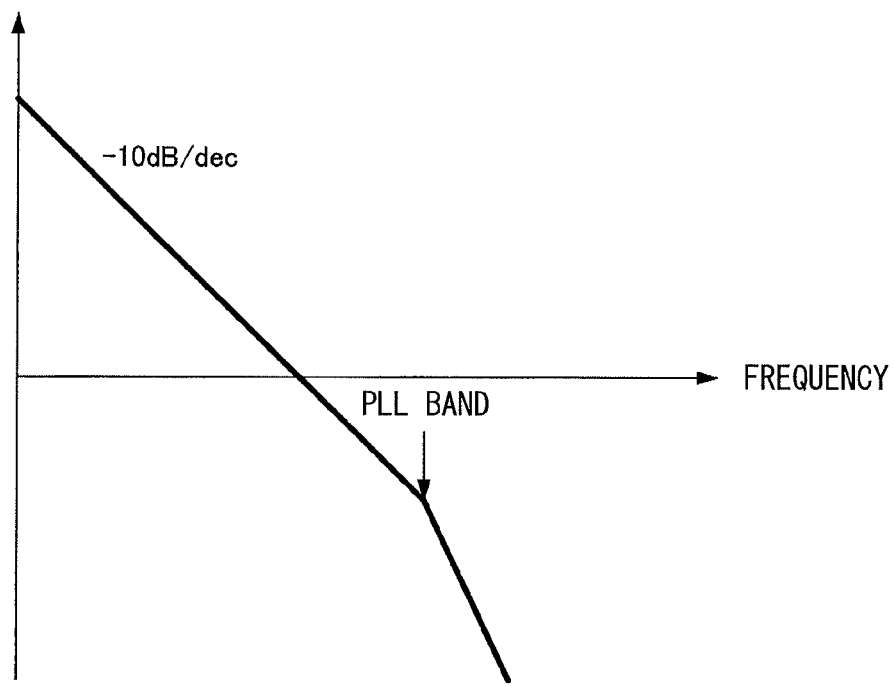
[ FIG. 17 ]
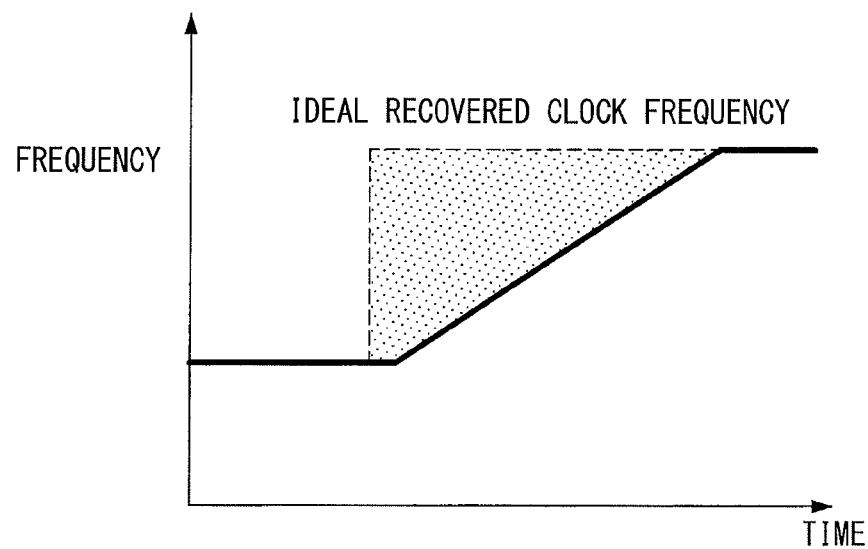

[ FIG. 18 ]
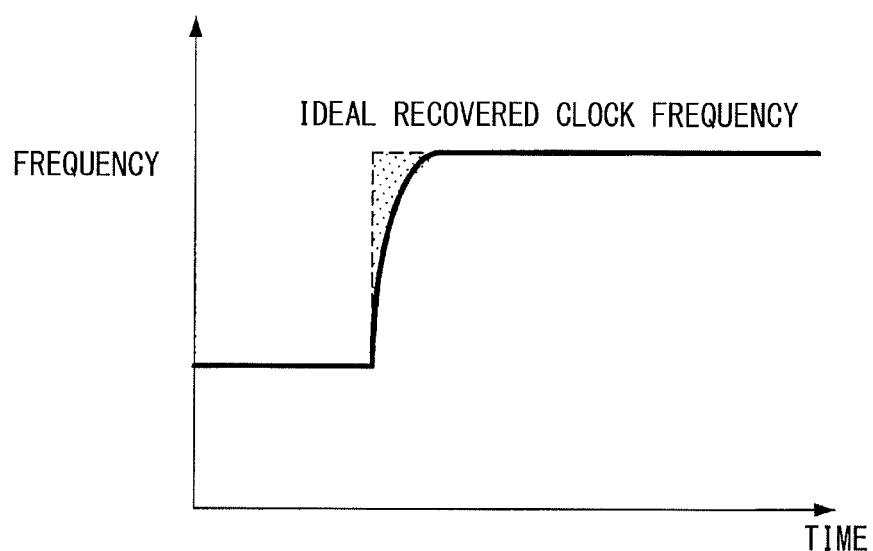

[FIG. 19]
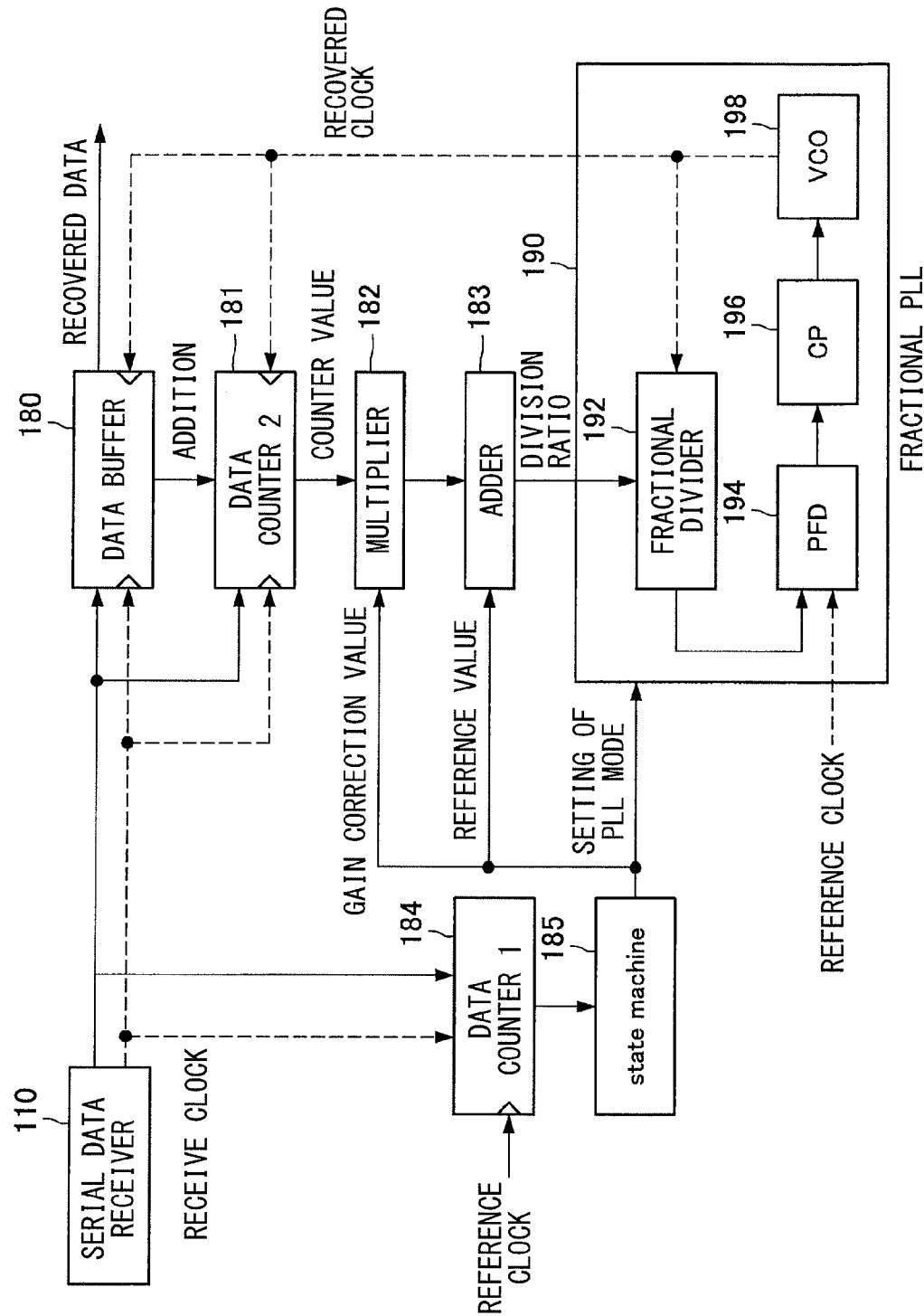

[ FIG. 20 ]
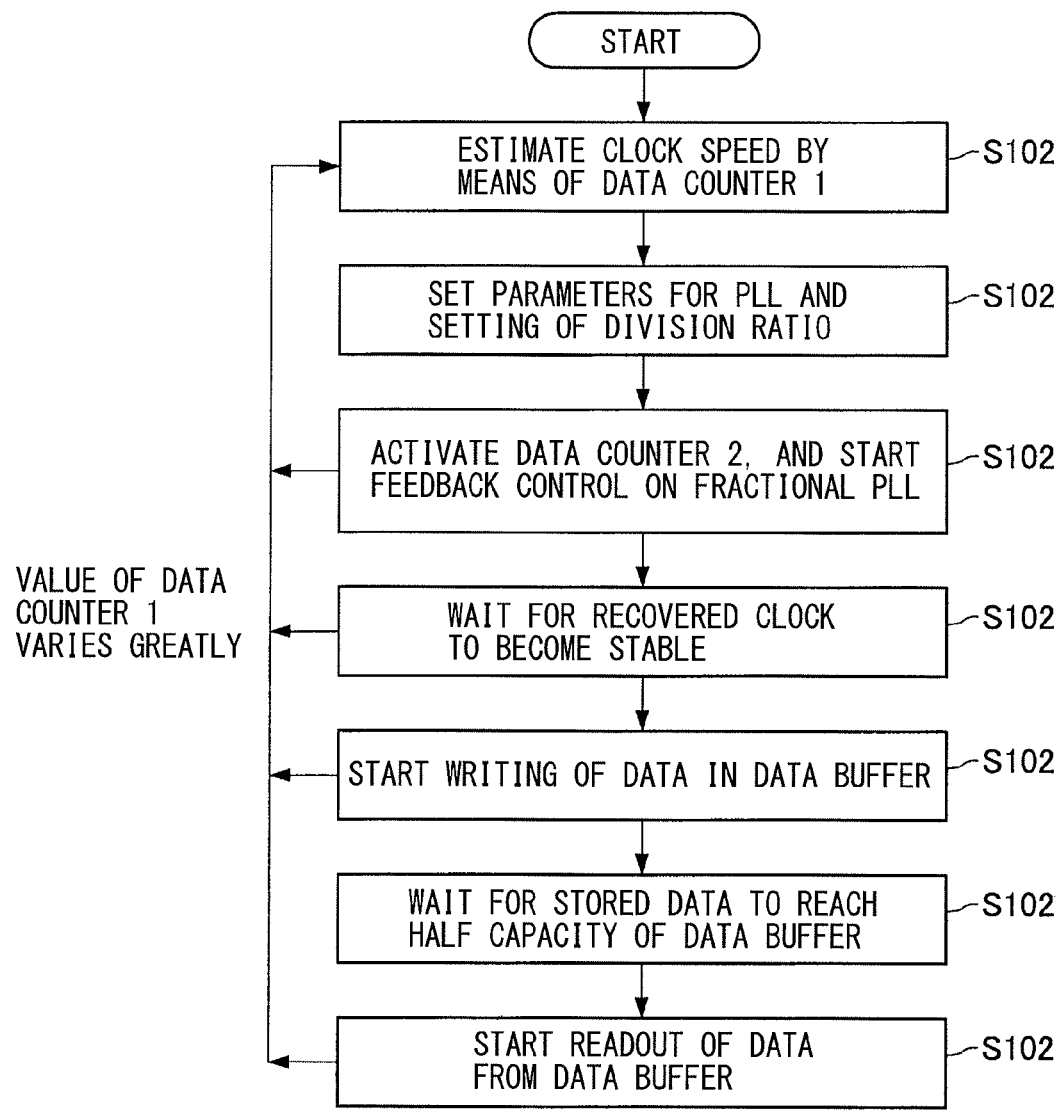

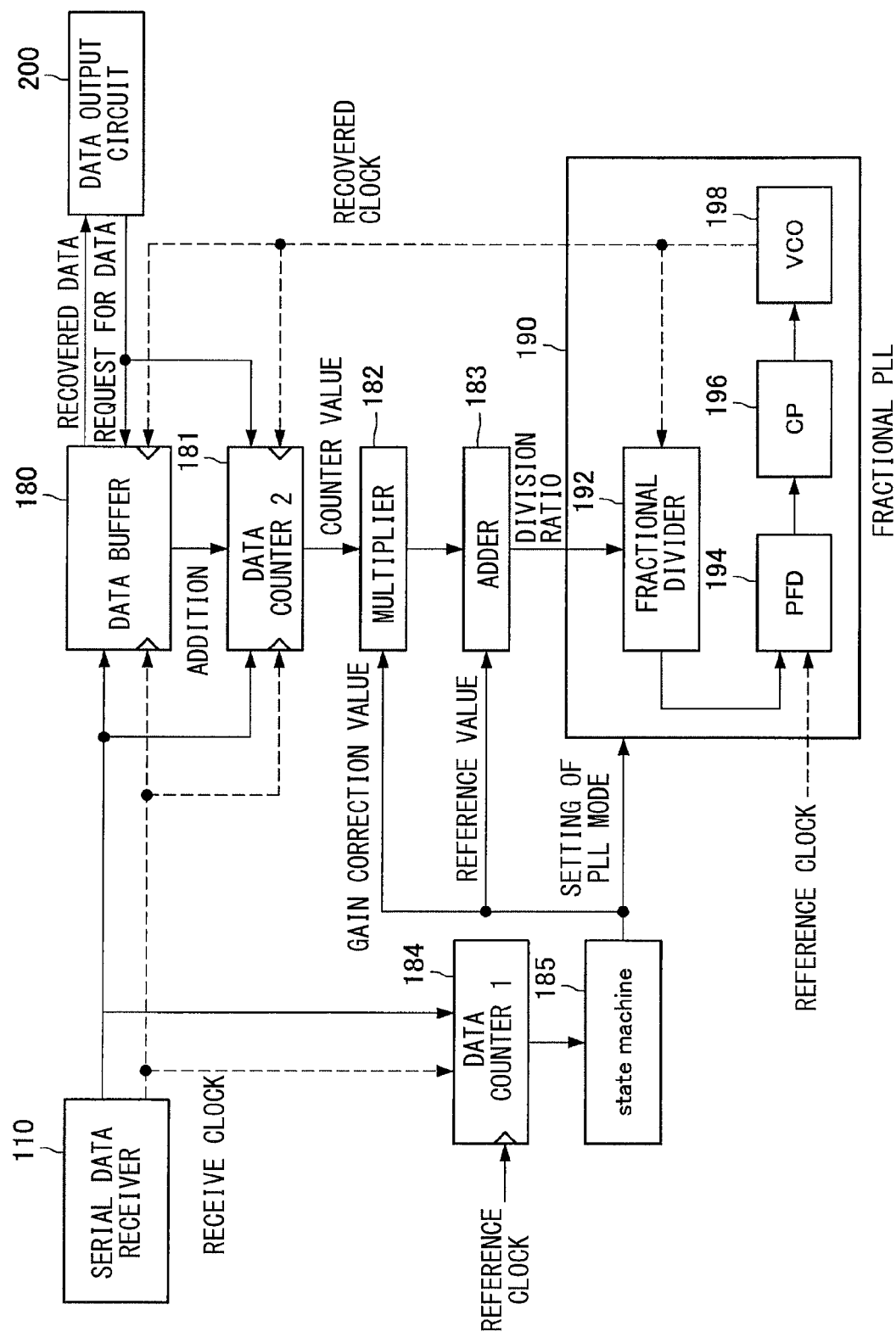
[FIG. 21]

SERIAL DATA TRANSMISSION DEVICE AND CLOCK RECOVERY DEVICE

TECHNICAL FIELD

The present disclosure relates to a serial data transmission device and a clock recovery device.

BACKGROUND ART

For a device that transmits data via serial communication, there is a system having a mechanism to transmit multiple pieces of data to a plurality of data transmission devices by daisy-chaining the data transmission devices. In such a system, it is necessary to transmit data by superimposing multiple data strings on a serial communication path. Methods of superimposing different pieces of data on the serial communication path include a method to packetize data and transmit packets of the data and a time-division multiplex (TDM) method to divide the path by a fixed length of time and transmit data. By using the TDM method, it becomes possible to superimpose multiple stable bands in a simple circuit configuration. There are disclosed literatures regarding data transmission by the TDM method, for example, PTL 1, etc.

CITATION LIST

Patent Literature

PTL 1: Japanese Unexamined Patent Application Publication No. 2009-20905

SUMMARY OF THE INVENTION

Problem to be Solved by the Invention

In a case where serial data is transmitted between daisy-chained data transmission devices, it is necessary to cause an entire network to work in synchronization with one data transmission device. However, even if the one data transmission device to be the basis of a clock becomes unnecessary, it is not possible to remove the one data transmission device from a system, which makes it difficult to dynamically switch the daisy chain connection. Furthermore, a serial transmission path from the one data transmission device also serves as a clock transmission path; therefore, in a case where there arises an issue in communication between the data transmission devices, transmission that does not have an issue also suffers disruption of communication.

Accordingly, the present disclosure proposes novel and improved serial data transmission device and clock recovery device that make it possible to dynamically switch a band or a data transmission path and enhance the stability to failure while multiplexing and transmitting data by the TDM method when serial data is transmitted between a plurality of daisy-chained data transmission devices.

Means for Solving the Problem

According to the present disclosure, there is provided a serial data transmission device including: a receiver that receives data serially transmitted by a time-division multiplex method from another device daisy-chained to the serial data transmission device; a transmitter that serially transmits data by the time-division multiplex method to another device daisy-chained to the serial data transmission device; and a controller that controls serial transmission by the receiver and the transmitter, in which the controller performs control to make the serial transmission by the transmitter adjustable.

Furthermore, according to the present disclosure, there is provided a clock recovery device including: a receiver that receives data from another device; and a clock recovery circuit that recovers a clock by means of a fractional PLL in accordance with reception of the data by the receiver, in which the clock recovery circuit calculates a division ratio of a frequency divider of the fractional PLL from a value obtained by computing a counter value of a first counter that counts up at timing of reception of data by the receiver and counts down at timing of a recovered clock.

Effects of the Invention

As described above, according to the present disclosure, it is possible to provide novel and improved serial data transmission device and clock recovery device that make it possible to dynamically switch a band or a data transmission path and enhance the stability to failure while multiplexing and transmitting data by the TDM method when serial data is transmitted between a plurality of daisy-chained data transmission devices.

It is to be noted that the effects described above are not necessarily limitative, and there may be any of effects described in the present specification or another effect conceivable from the present specification besides the above-described effects or instead of the above-described effects.

BRIEF DESCRIPTION OF DRAWINGS

FIG. 1 is an explanatory diagram illustrating a serial data transmission system.

FIG. 2 is an explanatory diagram illustrating a relationship among SLOT, control code, and frame.

FIG. 3 is an explanatory diagram illustrating a configuration example of a serial data transmission system according to an embodiment of the present disclosure.

FIG. 4 is an explanatory diagram that describes a table transmitted through a transmission path of the serial data transmission system according to the present embodiment.

FIG. 5 is an explanatory diagram for explaining how data is allocated in the serial data transmission system according to the present embodiment.

FIG. 6 is an explanatory diagram for explaining how data is allocated in the serial data transmission system according to the present embodiment.

FIG. 7 is an explanatory diagram for explaining how data is allocated in the serial data transmission system according to the present embodiment.

FIG. 8 is an explanatory diagram illustrating a functional configuration example of a serial data transmission device 100.

FIG. 9 is an explanatory diagram illustrating an example of data allocation to SLOTs by the serial data transmission device 100.

FIG. 10 is an explanatory diagram illustrating an example of a circuit configuration for controlling a clock speed of a serial transmitter 140 of the serial data transmission device 100.

FIG. 11 is an explanatory diagram illustrating an example of a detailed circuit configuration for controlling the clock speed of the serial transmitter 140 of the serial data transmission device 100.

FIG. 12 is a flowchart illustrating an operation example for controlling the clock speed of the serial transmitter 140.

FIG. 13 is an explanatory diagram illustrating an example of control of the clock speed of the serial transmitter 140 of the serial data transmission device 100 in a graphic form.

FIG. 14 is an explanatory diagram illustrating an example of variation in a recovered clock frequency in a case where an ideal recovered clock frequency varies in a typical clock recovery device.

FIG. 15 is an explanatory diagram illustrating a configuration example of a clock recovery circuit in the serial data transmission device 100 according to a second embodiment of the present disclosure.

FIG. 16 is an explanatory diagram illustrating a schematic drawing of an open-loop transfer function of a control loop of a fractional PLL 190.

FIG. 17 is an explanatory diagram illustrating an example of variation in a recovered clock frequency in a case where an ideal recovered clock frequency varies in a typical clock recovery device.

FIG. 18 is an explanatory diagram illustrating an example of variation in a recovered clock frequency in a case where an ideal recovered clock frequency varies in the clock recovery circuit illustrated in FIG. 15.

FIG. 19 is an explanatory diagram illustrating a modification example of the clock recovery circuit according to the second embodiment of the present disclosure.

FIG. 20 is a flowchart illustrating an operation example of the clock recovery circuit illustrated in FIG. 19.

FIG. 21 is an explanatory diagram illustrating a modification example of the clock recovery circuit according to the second embodiment of the present disclosure.

MODES FOR CARRYING OUT THE INVENTION

In the following, preferred embodiments of the present disclosure are described in detail with reference to accompanying drawings. It is to be noted that in the present specification and the drawings, components having substantially the same functional configuration are assigned the same reference numeral to omit repetition of description.

It is to be noted that description is given in the following order.
1. First Embodiment
 1.1. Outline
 1.2. Configuration Example and Operation Example
2. Second Embodiment
 2.1. Outline
 2.2. Configuration Example and Operation Example
3. Conclusion

1. First Embodiment

[1.1. Outline]

First, an outline of a first embodiment of the present disclosure is described.

For a device that transmits data via serial communication, there is a system having a mechanism to transmit multiple pieces of data to a plurality of data transmission devices by daisy-chaining the data transmission devices. In such a system, it is necessary to transmit data by superimposing multiple data strings on a serial communication path. Methods of superimposing different pieces of data on the serial communication path include a method to packetize data and transmit packets of the data and a time-division multiplex (TDM) method to divide the path by a fixed length of time and transmit data.

The packet division method is a method of dividing data into data strings having a given length and transmitting the data added with header information representing what information the data is about. While this method has a high degree of freedom in use of a serial communication band, the timing to transmit a packet to the communication path varies, and thus a transmitter and a receiver have to store packets to adjust the timing, which requires a large memory and increases the communication latency.

On the other hand, the TDM transmission method is a method of using the serial communication path divided by a fixed length of time. By using the TDM method, it becomes possible to superimpose multiple stable bands in a simple circuit configuration. However, in a case of performing daisy chain transmission using the TDM method in this way, it generally requires network synchronization of an entire network.

FIG. 1 is an explanatory diagram illustrating a serial data transmission system in which three serial data transmission devices 100a, 100b, and 100c are daisy-chained. In a case where serial transmission is performed between the three daisy-chained serial data transmission devices 100a, 100b, and 100c, for example, it is necessary to cause the entire network to work in synchronization with the serial data transmission device 100a.

Here, when there is introduced a system that dynamically switches the data input/output or the band allocation of each serial data transmission device, the clock of the serial data transmission device 100a is necessary at all times; therefore, even in a case where the serial data transmission device 100a becomes unnecessary, it is not possible to disconnect the serial data transmission device 100a. Therefore, in the system that dynamically switches the data input/output or the band allocation of each serial data transmission device, it is difficult to dynamically switch the daisy chain connection. Furthermore, a serial transmission path from the serial data transmission device 100a also serves as a clock transmission path; therefore, in a case where an issue occurs in communication between the serial data transmission device 100a and the serial data transmission device 100b, transmission on an unrelated path also suffers disruption of communication.

Accordingly, in the present embodiment, there is provided a technology that makes it possible to dynamically switch a band or a data transmission path and enhance the stability to failure while multiplexing and transmitting data by the TDM method when serial data is transmitted between a plurality of daisy-chained data transmission devices.

[1.2. Configuration Example and Operation Example]

Subsequently, a configuration example and an operation example of the serial data transmission system according to the present embodiment are described. In the present embodiment, as illustrated in FIG. 1, the serial data transmission system in which the plurality of (three, in FIG. 1) serial data transmission devices 100a, 100b, and 100c are daisy-chained is used. The serial data transmission devices 100a, 100b, and 100c each have a data input port and/or a data output port. Respective pieces of data inputted to the serial data transmission devices 100a and 100b are superimposed and transmitted in TDM serial transmission. In FIG. 1, the serial data transmission device 100a and the serial data transmission device 100b are coupled by a transmission path 10a, and the serial data transmission device 100*b* and the serial data transmission device 100*c* are coupled by a transmission path 10*b*.

A signal serially transmitted in the serial data transmission system illustrated in FIG. 1 is divided by a time unit called SLOT that is a unit of specific size. Each SLOT is assigned a number, and all SLOTs are transmitted in sequence. A unit of a cycle of these SLOT numbers is called a frame. Furthermore, a control code other than SLOT data is allotted a certain period of time, and is used for low-speed control channel transmission of other than the SLOT data. FIG. 2 is an explanatory diagram illustrating a relationship among SLOT, control code, and frame. In the present embodiment, one frame includes eight SLOTs and eight control codes. Needless to say, the respective numbers of SLOTs and control codes included in one frame are not limited to this example.

The frame transmission period is fixed to an approximately constant period in the entire network; however, the number of SLOTs allocated for each serial transmission is able to be set to a different value. The data amount per SLOT is constant, and, as a result, the data rate of each serial transmission path in the daisy chain is able to be made variable as needed. Thus, it is possible to ensure the minimum band and reduce the power consumption.

FIG. 3 is an explanatory diagram illustrating a configuration example of the serial data transmission system according to the embodiment of the present disclosure. The serial data transmission devices 100*a*, 100*b*, and 100*c* have a similar configuration. Here, a configuration example of the serial data transmission device 100*a* is described with the serial data transmission device 100*a* as an example.

The serial data transmission device 100*a* includes a serial receiver 110*a*, a data unloader (unloader FIFO) 120*a*, a data buffer (daisy chain FIFO) 130*a*, a serial transmitter 140*a*, and a data loader (loader FIFO) 150*a*.

The serial receiver 110*a* receives data from the input-stage serial data transmission device through a transmission path (in the example illustrated in FIG. 2, the input-stage serial data transmission device does not exist). Specific data, for example, data for the serial data transmission device 100*a* that the serial receiver 110*a* has received is read out from the data unloader 120*a*, and data for the other devices is sent to the data buffer 130*a*.

The data unloader 120*a* outputs the specific data, for example, the data for the serial data transmission device 100*a* that the serial receiver 110*a* has received in a first-in, first-out (FIFO) manner.

The data buffer 130*a* buffers data directed to the output-stage serial data transmission device (in the example illustrated in FIG. 2, the serial data transmission device 100*b* or 100*c*). Then, the data buffer 130*a* sends the buffered data to the serial transmitter 140*a* in a FIFO manner. Therefore, the data buffer 130*a* temporarily stores, of the data received by the serial receiver 110*a*, data to be sent to the output-stage serial data transmission device, and outputs the stored data to the serial transmitter 140*a*.

The serial transmitter 140*a* outputs data directed to the output-stage serial data transmission device to the transmission path 10*a*. The data directed to the serial data transmission device includes data sent from the data buffer 130*a* and data sent from the data loader 150*a*.

The data loader 150*a* inputs data directed to the output-stage serial data transmission device. The data that the data loader 150*a* has inputted is sent to the serial transmitter 140*a* in a FIFO manner.

The serial data transmission devices each have a unique ID in the daisy chain connection. A data string loaded from each data transmission device has an ID of the serial data transmission device that has loaded it as a data ID. Then, through each of the transmission paths 10*a* and 10*b*, information of which of data SLOTs currently being transmitted is allocated data of what ID or is not allocated anything (hereinafter, this information is referred to as a Slot No/ID table) is transmitted by use of a control signal path.

FIG. 4 is an explanatory diagram that describes the Slot No/ID table transmitted through the transmission path of the serial data transmission system according to the present embodiment. In an example illustrated in FIG. 4, SLOTs 0 to 2 are allocated data of ID 0, SLOTs 3 and 4 are allocated data of ID 1, and SLOTs 5 and 6 are allocated data of ID 2. Each transmission device autonomously determines which of SLOTs is allocated data of what ID. An example of data allocation is described below.

FIG. 5 is an explanatory diagram for explaining how data is allocated in the serial data transmission system according to the present embodiment. The data loader (for example, the data loader 150*a*) built into each serial data transmission device determines the number of SLOTs desired to load data in accordance with content of input data or a request from a user. This number of SLOTs is referred to as LOAD_SLOT_SIZE in the present embodiment.

As illustrated in FIG. 5, each serial data transmission device allocates as many pieces of data as the requested number of SLOTs to SLOTs, and performs transmission of the data through the transmission path. In an example of FIG. 4, the serial data transmission device 100*a* determines LOAD_SLOT_SIZE=3, and assigns SLOTs 0 to 2 ID 0 that is an ID of the serial data transmission device 100*a*. The serial data transmission device 100*b* determines LOAD_SLOT_SIZE=2, and assigns SLOTs 0 and 1 ID 1 that is an ID of the serial data transmission device 100*b*, and assigns SLOTs 2 to 4 ID 0 that is an ID of the serial data transmission device 100*a*. The serial data transmission device 100*c* determines LOAD_SLOT_SIZE=2, and assigns SLOTs 0 and 1 ID 2 that is an ID of the serial data transmission device 100*c*, and assigns SLOTs 2 and 3 ID 1 that is an ID of the serial data transmission device 100*b*, and then assigns SLOTs 4 to 6 ID 0 that is an ID of the serial data transmission device 100*a*.

Here, for example, in a case where data to be loaded by the serial data transmission device 100*b* has run out, the serial data transmission device 100*b* stops allocation of data of ID 1 to SLOTs. As information that this allocation to SLOTs has been canceled is transmitted to a downstream device in the daisy chain, the allocation to SLOTs with ID1 is all canceled. However, as long as the transmission continues, assignments of other IDs are continued, and a change of allocated SLOTs is not made. Thus, it is possible for the serial data transmission system according to the present embodiment to continue the transmission of other data even when a particular serial data transmission device has stopped the transmission of data.

FIG. 6 is an explanatory diagram for explaining how data is allocated in the serial data transmission system according to the present embodiment. FIG. 5 illustrates an example where the serial data transmission device 100*b* stops allocation of data of ID 1 to SLOTs because data to be loaded by the serial data transmission device 100*b* has run out. As the serial data transmission device 100*b* has stopped the allocation of data of ID 1 to SLOTs, the output-stage serial data transmission device 100*c* also stops the allocation of data of ID 1 to SLOTs.

In this state, assume here that the serial data transmission device 100*b* again starts the transmission with LOAD_SLOT_SIZE set to 3. In that case, each downstream serial data transmission device assigns empty SLOTs ID 1. Also in this case, each downstream serial data transmission device uses the empty SLOTs without changing the existing assignments of the IDs. Therefore, it becomes possible for the serial data transmission system according to the present embodiment to re-start the data transmission by the serial data transmission device 100b without affecting the other data transmission.

FIG. 7 is an explanatory diagram for explaining how data is allocated in the serial data transmission system according to the present embodiment. The serial data transmission device 100b determines LOAD_SLOT_SIZE=3, and assigns SLOTs 0, 1, and 5 ID 1 that is an ID of the serial data transmission device 100b, and assigns SLOTs 2 to 4 ID 0 that is an ID of the serial data transmission device 100a. That is, the existing assignment of ID 0 is not changed. Then, the serial data transmission device 100c determines LOAD_SLOT_SIZE=2, and assigns SLOTs 0 and 1 ID 2 that is an ID of the serial data transmission device 100c, and assigns SLOTs 2, 3, and 7 ID 1 that is an ID of the serial data transmission device 100b, and then assigns SLOTs 4 to 6 ID 0 that is an ID of the serial data transmission device 100a.

Subsequently, SLOT mapping and a data transmission mechanism of the serial data transmission device are described. FIG. 8 is an explanatory diagram illustrating a functional configuration example of the serial data transmission device 100.

The serial receiver 110 receives a Slot No/ID table 115 from the input-stage serial data transmission device through a control channel, and updates a transmitting-side Slot No/ID table 135 with a LOAD_SLOT_TABLE and an ID of its own device.

The serial data transmission device 100 updates the transmitting-side Slot No/ID table 135 in the following procedure.

First, the serial data transmission device 100 checks if as many IDs of SLOTs as those included in the receiving-side Slot No/ID table 115 exist in the transmitting-side Slot No/ID table 135. In a case where the number of IDs included in the Slot No/ID table 135 is smaller than the number of IDs included in the Slot No/ID table 115, the serial data transmission device 100 assigns an empty SLOT an additional ID. Meanwhile, in a case where the number of IDs included in the Slot No/ID table 115 is smaller than the number of IDs included in the Slot No/ID table 135, the serial data transmission device 100 deletes the assignments of the IDs from the Slot No/ID table 135.

Then, in a case where the Slot No/ID table 135 includes an ID that is not included in the Slot No/ID table 115 and is not its own ID, the serial data transmission device 100 deletes the ID.

Then, the serial data transmission device 100 checks if there are empty SLOTs equivalent to LOAD_SLOT_SIZE in the Slot No/ID table 135. In a case where the number of empty SLOTs in the Slot No/ID table 135 is smaller than LOAD_SLOT_SIZE, the serial data transmission device 100 assigns an empty SLOT an additional ID. In a case where LOAD_SLOT_SIZE is smaller than the number of empty SLOTs in the Slot No/ID table 135, the serial data transmission device 100 deletes the assignments of the IDs from the Slot No/ID table 135.

Then, in a case where there is an ID that is not desired to be propagated in the daisy chain, the serial data transmission device 100 excludes the ID from the assignment, and deletes the assignment of the ID from the Slot No/ID table 135.

Through this procedure, the serial data transmission device 100 is able to dynamically switch the data path without changing the once assigned SLOT numbers as much as possible and without changing the existing assignments of the IDs to SLOTs.

Using the Slot No/ID table 115, the serial data transmission device 100 creates a Slot map table (a TX Slot map table). The Slot map table is generated by a map table generator 125. The Slot map table is a table including, with respect to each SLOT, information of (1) allocation of a received SLOT+a number of the received SLOT, (2) allocation from the data loader 150, and (3) no allocation. With reference to this table, the serial data transmission device 100 allocates data coming from the serial receiver 110 and data coming from the data loader 150 to SLOTs. Actual allocation is performed by a transmission stream mapper 145. The transmission stream mapper 145 may serve as an example of a controller of the present disclosure. As described above, the frame transmission period is fixed to an approximately constant period in the entire network; however, the number of SLOTs allocated for each serial transmission is able to be set to a different value. Therefore, the transmission stream mapper 145 is able to make the data rate of the serial transmission path variable as needed by changing the number of SLOTs allocated for serial transmission to the output-stage serial data transmission device.

FIG. 9 is an explanatory diagram illustrating an example of data allocation to SLOTs by the serial data transmission device 100. FIG. 9 illustrates an example of data allocation to SLOTs by the serial data transmission device 100 when data coming from the serial receiver 110 and data inputted from the data loader 150 are outputted on the basis of contents of a Slot map table.

Referring to the Slot map table, it is described that data of receiving-side SLOT 2 is allocated to transmitting-side SLOT 0. Likewise, it is described that data of receiving-side SLOT 3 is allocated to transmitting-side SLOT 1, and data of receiving-side SLOT 6 is allocated to transmitting-side SLOT 4. Furthermore, it is described that data inputted from the data loader 150 is allocated to transmitting-side SLOTs 2, 3, and 7. Then, it is described that nothing is allocated to transmitting-side SLOTs 5 and 6.

Therefore, in the example of FIG. 9, A2 that is the data of receiving-side SLOT 2 is stored in transmitting-side SLOT 0; A3 that is the data of receiving-side SLOT 3 is stored in transmitting-side SLOT 1; L0 that is the first data from the data loader 150 is stored in transmitting-side SLOT 2; and L1 that is the second data from the data loader 150 is stored in transmitting-side SLOT 3.

Likewise, A6 that is the data of receiving-side SLOT 6 is stored in transmitting-side SLOT 4; and L2 that is the third data from the data loader 150 is stored in transmitting-side SLOT 7. Furthermore, no data is allocated to transmitting-side SLOTs 5 and 6 (blank).

Data coming from the serial receiver 110 is inputted to the data buffer 130 having a width equivalent to the number of SLOTs (=a width equivalent to one frame). In a case where data on its own device side is desired by reference to the Slot map table, the serial data transmission device 100 outputs data of a corresponding SLOT. A read address of the data buffer 130 is incremented each time the transmitting side transmits one frame.

Data inputted from the data loader 150 is also temporarily stored in the FIFO, and, in a case where the data from the data loader 150 is desired by reference to the Slot map table, is read out from the FIFO and outputted from the serial transmitter 140.

Furthermore, in a case where nothing is allocated to the Slot map table, some meaningless data is outputted from the serial transmitter 140.

In either case, in a case where there exists no data when data is read out from the FIFO, non-typical invalid data (null) indicating that there is no data is outputted to a SLOT. Thus, even if the transmit frame rate becomes higher than the receive frame rate, data is automatically padded with this null data, and therefore it does not affect the data transmission.

In a case where the transmit frame rate is lower than the receive frame rate, a buffer overflow occurs in the data buffer 130. Therefore, in a case where the transmit frame rate is lower than the receive frame rate, the serial data transmission device 100 increases the data transmission rate and controls the transmitting-side frame rate to be equal to or higher than the receiving-side frame rate, and then starts the transmission of data. At this time, the transmission data transmission rate is desired to be swept at a sufficiently low rate to prevent disconnection in the existing serial communication.

FIG. 10 is an explanatory diagram illustrating an example of a circuit configuration for controlling the clock speed of the serial transmitter 140 of the serial data transmission device 100. In FIG. 10, a division ratio control circuit 160 and a fractional phase-locked loop (PLL) 170 are illustrated. The fractional PLL 170 includes a fractional divider 172, a phase comparator (a phase frequency detector (PFD)) 174, a charge pump (CP) 176, and a voltage-controlled oscillator (VCO) 178.

The division ratio control circuit 160 receives a frame receive pulse from the serial receiver 110 and a frame transmit pulse from the serial transmitter 140, and compares their periods. In a case where the period of the pulse from the serial transmitter 140 is longer, the fractional PLL 170 that generates a clock of the serial transmitter 140 is controlled to increase the data rate of the serial transmitter 140 until the respective periods of a frame receive pulse and a frame transmit pulse become equal. When the respective periods of a frame receive pulse and a frame transmit pulse have become equal, the serial data transmission device 100 accesses the data buffer and outputs data to the serial transmitter 140. The serial data transmission device 100 performs feedback control at all times even after the restart of data transmission.

FIG. 11 is an explanatory diagram illustrating an example of a detailed circuit configuration for controlling the clock speed of the serial transmitter 140 of the serial data transmission device 100. The division ratio control circuit 160 includes a period comparator 161, a counter 162, a multiplier 163, a low-pass filter 164, and an adder 165. Then, FIG. 12 is a flowchart illustrating an operation example for controlling the clock speed of the serial transmitter 140. A control phase of the clock speed of the serial transmitter 140 is divided into a coarse adjustment phase and a precise adjustment phase as illustrated in FIG. 12 to suppress large variation of clocks.

The division ratio control circuit 160 receives a frame receive pulse from the serial receiver 110 and a frame transmit pulse from the serial transmitter 140, and compares their periods by means of the period comparator 161 (Step S101). If the period of the frame transmit pulse is longer than the period of the frame receive pulse, a given value is added to the counter 162 (Step S102), and the division ratio control circuit 160 returns to the comparison at Step S101. A counter value of the counter 162 is sent to the multiplier 163 and is multiplied by a predetermined gain constant, and passes through the low-pass filter 164 and becomes a division ratio additional value. The division ratio additional value is sent to the adder 165 and is added to a normal frequency division value, and then is provided as a division ratio to the fractional PLL 170.

That is, in the coarse adjustment phase, by means of the period comparator 161, the value of the counter is added up at constant speed until the period of a frame transmit pulse becomes equal to or longer than the period of a frame receive pulse. As a result, the rate of data transmission from the serial transmitter 140 is increased at a constant rate.

Meanwhile, if the period of a frame transmit pulse is shortened by the control of the division ratio control circuit 160, and the period of a frame transmit pulse becomes shorter than the period of a frame receive pulse, the division ratio control circuit 160 makes the control phase transition to the precise adjustment phase. In the precise adjustment phase, the division ratio control circuit 160 starts the update of the counter value of the counter 162 based on the frame receive pulse and the frame receive pulse (Step S103). The counter value of the counter 162 is incremented by one if a frame receive pulse is inputted to the period comparator 161, and, if a frame transmit pulse is inputted to the period comparator 161, is decremented by one only in a case where the counter value is greater than 0. That is, the counter value is controlled not to become 0 or less.

FIG. 13 is an explanatory diagram illustrating an example of control of the clock speed of the serial transmitter 140 of the serial data transmission device 100 in a graphic form. As illustrated in FIG. 13, in the coarse adjustment phase, the rate of data transmission from the serial transmitter 140 is increased at a constant rate. Then, if the period of a frame transmit pulse becomes shorter than the period of a frame receive pulse, the control phase makes transition to the precise adjustment phase, and the period of a frame transmit pulse becomes closer to the period of a frame receive pulse to coincide with the period of a frame receive pulse. By performing control in this way, the division ratio control circuit 160 is able to bring the clock speed of the serial transmitter 140 closer to the receive rate of the serial receiver 110 without causing it to fluctuate around the receive rate of the serial receiver 110.

As described above, according to the first embodiment of the present disclosure, there is provided the serial data transmission device 100 that makes it possible to realize, in a simple circuit configuration, the operation to change the state of daisy chain connection while keeping the existing data transmission or change the way of data superimposition when a large number of data strings are superimposed and transmitted simultaneously between the daisy-chained serial data transmission devices by the time-division multiplex method.

2. Second Embodiment

[2.1. Outline]

Subsequently, an outline of a second embodiment of the present disclosure is described.

In recent years, a system that performs communicating by imposing a signal on another transmit/receive clock having a different clock frequency from data to be transmitted when the data is transmitted through a signal path is widely used. In this case, a data receiver is required to extract a valid packet or word from received data, and recover a clock in accordance with the received data, and then output a signal imposed on the clock. For example, Japanese Unexamined Patent Application Publication No. 2015-46837 discloses a configuration in which the data amount of arrived data is stored in a buffer, and a recovered clock frequency is increased or decreased depending on whether or not the stored amount is larger than a target threshold.

In this configuration, in a case where there is no fluctuation in a clock frequency of arrived data, the system works stably; however, in a case where the frequency fluctuates, the following capability of a clock with respect to fluctuation is weak, and there may be an issue in transmission stability. FIG. 14 is an explanatory diagram illustrating an example of variation in a recovered clock frequency in a case where an ideal recovered clock frequency varies in a typical clock recovery device. As illustrated in FIG. 14, in the typical clock recovery device, in a case where the ideal recovered clock frequency varies, a recovered clock frequency comes closer to the ideal recovered clock frequency over time. Thus, the typical clock recovery device is weak in the following capability of a clock with respect to fluctuation.

Furthermore, in the existing method, binary control, in which a frequency is increased or decreased on the basis of whether or not a remaining capacity of the data buffer exceeds a threshold, is performed. Thus, when a clock frequency to be recovered fluctuates, as illustrated in FIG. 14, a change rate of the recovered clock frequency is constant, and thus, when the frequency varies greatly, it requires a lot of time to follow it. Therefore, the size of the data buffer is also required to be increased to absorb a time lag of data at the time of this variation.

Accordingly, in the second embodiment of the present disclosure, there is provided a clock recovery device that makes it possible to improve tolerance for clock fluctuation and reduce the size of the data buffer at the same time.

[2.2. Configuration Example and Operation Example]

In the following description, there is provided an example of a configuration for the serial receiver 110 to recover received data in the serial data transmission device 100 described in the first embodiment; however, the present disclosure is not limited to this example. The technology described in the present embodiment is also applicable to any device that extracts a valid packet or word from received data, and recovers a clock in accordance with the received data, and then outputs a signal imposed on the clock.

FIG. 15 is an explanatory diagram illustrating a configuration example of a clock recovery circuit in the serial data transmission device 100 according to the second embodiment of the present disclosure. In FIG. 15, the serial receiver 110, a data buffer 180, a data counter 181, a multiplier 182, an adder 183, and a fractional PLL 190 are illustrated. Then, the fractional PLL 190 includes a fractional divider 192, a PFD 194, a CP 196, and a VCO 198.

The clock recovery circuit illustrated in FIG. 15 creates a recovered clock from a receive clock received by the serial receiver 110 and received data synchronized with the clock by means of the fractional PLL 190, and outputs recovered data imposed on the clock from the data buffer 180.

The data counter 181 is a counter that counts up when having received data from the serial receiver 110, and counts down on the basis of a recovered clock from the fractional PLL 190. Therefore, if a frequency of the recovered clock from the fractional PLL 190 is lower than a frequency when the data has been received from the serial receiver 110, a counter value of the data counter 181 becomes larger, and becomes smaller in an opposite case.

The multiplier 182 multiplies the counter value from the data counter 181 by a predetermined gain correction value and outputs the multiplied value. The adder 183 adds a predetermined reference value to the value outputted from the multiplier 182. The adder 183 sends the value after the addition as a division ratio to the fractional divider 192.

Using the division ratio sent from the adder 183, the fractional PLL 190 generates a recovered clock from a reference clock. If the division ratio of the fractional divider 192 increases, a recovered clock frequency increases, and the fractional PLL 190 is subjected to feedback control to obtain a frequency desired to recover data through feedback to the fractional PLL 190.

FIG. 16 is an explanatory diagram illustrating a schematic drawing of an open-loop transfer function of a control loop of the fractional PLL 190. In a case where a loop band of the control loop of the fractional PLL 190 is set to a band lower than a PLL band, this loop is a primary loop, and becomes an inherently stable control loop. By setting the loop band of the control loop of the fractional PLL 190 to a band lower than the PLL band, the control stability is ensured, and at the same time, smooth following with respect to fluctuation in a clock becomes possible.

FIG. 17 is an explanatory diagram illustrating an example of variation in a recovered clock frequency in a case where an ideal recovered clock frequency varies in a typical clock recovery device. FIG. 18 is an explanatory diagram illustrating an example of variation in a recovered clock frequency in a case where an ideal recovered clock frequency varies in the clock recovery circuit illustrated in FIG. 15. In the clock recovery circuit according to the present embodiment, when an ideal recovered clock frequency varies greatly, the frequency greatly follows the ideal frequency. As illustrated in FIG. 18, the clock recovery circuit according to the present embodiment is therefore able to cause the frequency to follow the ideal frequency at higher speed than the typical clock recovery device. By causing the frequency to follow the ideal frequency at higher speed, the clock recovery circuit according to the present embodiment makes it possible to reduce a phase shift of the clock to be absorbed by the data buffer 180 and reduce the size of the data buffer 180.

FIG. 19 is an explanatory diagram illustrating a modification example of the clock recovery circuit according to the second embodiment of the present disclosure. In FIG. 19, the serial receiver 110, the data buffer 180, data counters 181 and 184, the multiplier 182, the adder 183, a state machine 185, and the fractional PLL 190 are illustrated.

The data counter 184 is a data counter that determines how many pieces of received data arrive in a given period of time on the basis of a reference clock. The data counter 184 determines how many pieces of received data arrive in the given period of time on the basis of a reference clock, thereby estimating an approximate frequency of a recovered clock. The data counter 184 estimates an approximate frequency of a recovered clock, and sends information of the frequency to the state machine 185.

The state machine 185 outputs a gain correction value outputted to the multiplier 182, a reference value outputted to the adder 183, and setting of PLL mode outputted to the fractional PLL 190 on the basis of the information of the approximate frequency of the recovered clock sent from the data counter 184. The setting of PLL mode outputted to the fractional PLL 190 is, for example, settings of a pre-divider (a divider provided in the input stage of the PFD 194), a post-divider (the fractional divider 192), and the VCO 198, and the like.

The clock recovery circuit illustrated in FIG. 19 estimates an approximate frequency of a recovered clock by means of the data counter 184, and changes the gain correction value, the reference value, and the setting of PLL mode by means of the state machine 185, thereby making it possible to recover a clock over a wider range of frequencies.

FIG. 20 is a flowchart illustrating an operation example of the clock recovery circuit illustrated in FIG. 19. The clock recovery circuit illustrated in FIG. 19 estimates a recovered clock speed by means of the data counter 184 (Step S111), and sets parameters for the fractional PLL 190 and setting of a division ratio by means of the state machine 185 (Step S112).

Then, the clock recovery circuit illustrated in FIG. 19 activates the data counter 181, and starts feedback control on the fractional PLL 190 (Step S113), and then waits for the recovered clock to become stable (Step S114). Then, the clock recovery circuit illustrated in FIG. 19 starts writing of data in the data buffer 180 (Step S115), and waits for data stored in the data buffer 180 to reach a predetermined amount, for example, half the capacity of the data buffer 180. When data stored in the data buffer 180 reaches the predetermined amount, the clock recovery circuit illustrated in FIG. 19 starts reading of data from the data buffer 180 (Step S116).

Here, if the value of the data counter 184 varies greatly, and the degree of variation exceeds a predetermined allowable value, i.e., an approximate frequency of a recovered clock varies greatly, the clock recovery circuit illustrated in FIG. 19 returns to the process at Step S111. A variation amount of the value of the data counter 184 that causes the clock recovery circuit to return to the process at Step S111 is not limited to a specific amount; however, for example, if a frequency of a recovered clock is increased and becomes a frequency that causes the data buffer 180 to be filled up with data in a predetermined time, the clock recovery circuit illustrated in FIG. 19 returns to the process at Step S111.

FIG. 21 is an explanatory diagram illustrating a modification example of the clock recovery circuit according to the second embodiment of the present disclosure. In FIG. 21, the serial receiver 110, the data buffer 180, the data counters 181 and 184, the multiplier 182, the adder 183, the state machine 185, a low-pass filter 186, and the fractional PLL 190 are illustrated.

The low-pass filter 186 is a digital low-pass filter for smoothing of fluctuation when a frequency of a recovered clock outputted from the fractional PLL 190 fluctuates. That is, the clock recovery circuit illustrated in FIG. 21 applies the low-pass filter 186 to the counter value of the data counter 181, which makes it possible to suppress the fluctuation in a frequency of a recovered clock.

In FIG. 21, a data output circuit 200 is also illustrated. The data output circuit 200 is a circuit that sends out a data request signal to the data buffer 180, thereby reading out data stored in the data buffer 180 and outputting the read data. In a case of performing intermittent data output, the clock recovery circuit illustrated in FIG. 21 uses a data request signal from the data output circuit 200 as a trigger for subtraction of the data counter 181. That is, the clock recovery circuit illustrated in FIG. 21 is able to apply feedback to the PLL to adjust a clock when the data output circuit 200 performs intermittent readout.

3. Conclusion

As described above, according to the first embodiment of the present disclosure, it is possible to provide the serial data transmission device 100 that makes it possible to realize, in a simple circuit configuration, the operation to change the state of daisy chain connection while keeping the existing data transmission or change the way of data superimposition when a large number of data strings are superimposed and transmitted simultaneously between the daisy-chained serial data transmission devices by the time-division multiplex method.

Furthermore, according to the second embodiment of the present disclosure, it is possible to provide the clock recovery device that performs counting based on the amount of data received and a clock generated by the fractional PLL, thereby making it possible to improve tolerance for clock fluctuation and reduce the size of the data buffer at the same time.

As above, the preferred embodiments of the present disclosure have been described in detail with reference to the accompanying drawings; however, the technical scope of the present disclosure is not limited to these examples. It is obvious that those having ordinary skill in the technical field of the present disclosure could easily arrive at various alterations or modifications within the scope of the technical idea described in claims, and it is understood that these also should naturally fall under the technical scope of the present disclosure.

Furthermore, the effects described in the present specification are only explanatory or exemplary and not limitative. That is, the technology according to the present disclosure may achieve other effects that should be understood from description of the present specification by those skilled in the art in addition to the above-described effects or instead of the above-described effects.

It is to be noted that the following configurations also fall under the technical scope of the present disclosure.

(1)

A serial data transmission device including:

a receiver that receives data serially transmitted by a time-division multiplex method from another device daisy-chained to the serial data transmission device;

a transmitter that serially transmits data by the time-division multiplex method to another device daisy-chained to the serial data transmission device; and a controller that controls serial transmission by the receiver and the transmitter, in which the controller performs control to make the serial transmission by the transmitter adjustable.

(2)

The serial data transmission device according to (1), in which the controller performs control to make the serial transmission by the transmitter adjustable by changing the number of time slots to be time-division multiplexed.

(3)

The serial data transmission device according to (1) or (2), in which the controller uniquely allocates data to be transmitted by the serial data transmission device to time slots to be time-division multiplexed, and causes the transmitter to transmit the data while maintaining signal allocation of data to be transmitted by the other device.

(4)

The serial data transmission device according to (3), in which the controller causes the transmitter to transmit identification information of the data allocated to the time slots through a low-speed control channel superimposed on a transmission path between the serial data transmission device and the other device.

(5)

The serial data transmission device according to (4), in which the controller revises assignment of the identification information of the data allocated to the transmitting-side time slots on the basis of assignment of the identification information received by the receiver and information of the data to be transmitted by the serial data transmission device.

(6)

The serial data transmission device according to any one of (2) to (5), further including a clock adjusting circuit that increases a transmitting-side clock speed only in a case where a transmitting-side repetition period of the time slots to be time-division multiplexed is longer than a receiving-side repetition period.

(7)

The serial data transmission device according to (6), in which the clock adjusting circuit increases a division ratio of a fractional PLL that generates a clock to control the transmitter on the basis of a value of a counter that is added at timing of a cycle of the time slots received by the receiver and is subtracted at timing of a cycle of the time slots transmitted by the transmitter.

(8)

The serial data transmission device according to (6) or (7), in which the clock adjusting circuit implements a phase of precisely adjusting a clock to control the transmitter after a phase of increasing a speed of the clock to control the transmitter at a predetermined speed when a communication speed of the transmitter is increased.

(9)

The serial data transmission device according to any one of (1) to (8), in which in a case where a transmitting-side data transmission speed is lower than a receiving-side data transmission speed, the controller inserts invalid data and causes the transmitter to transmit the invalid data.

(10)

A clock recovery device including:

a receiver that receives data from another device; and a clock recovery circuit that recovers a clock by means of a fractional PLL in accordance with reception of the data by the receiver, in which the clock recovery circuit calculates a division ratio of a frequency divider of the fractional PLL from a value obtained by computing a counter value of a first counter that counts up at timing of reception of data by the receiver and counts down at timing of a recovered clock.

(11)

The clock recovery device according to (10), in which the clock recovery circuit estimates a frequency of the clock to be recovered on the basis of a counter value of a second counter that counts the number of pieces of arrived data received by the receiver in a predetermined time.

(12)

The clock recovery device according to (10) or (11), in which the clock recovery circuit controls the clock to be recovered by setting the division ratio of the frequency divider of the fractional PLL to a value obtained by performing an operation on the counter value of the first counter by a predetermined constant.

(13)

The clock recovery device according to any one of (10) to (12), in which the clock recovery circuit controls the clock to be recovered by setting the division ratio of the frequency divider of the fractional PLL to a value obtained by causing the counter value of the first counter to pass through a low-pass filter and thereafter performing an operation on the counter value of the first counter by the predetermined constant.

REFERENCE SIGNS LIST 10a transmission path
10b transmission path
100 serial data transmission device
110 serial receiver
115 ID table
130 data buffer
135 ID table
140 serial transmitter
145 transmission stream mapper
150 data loader
160 division ratio control circuit
161 period comparator
162 counter
163 multiplier
164 low-pass filter
165 adder
170 fractional PLL
190 fractional PLL

The invention claimed is:

1. A serial data transmission device comprising:
   a receiver that receives data serially transmitted by a time-division multiplex method from a first other device daisy-chained to the serial data transmission device;
   a transmitter that serially transmits data by the time-division multiplex method to a second other device daisy-chained to the serial data transmission device; and
   a controller that controls serial transmission by the receiver and the transmitter,
   wherein the controller performs control to make the serial transmission by the transmitter adjustable by changing a number of time slots to be time-division multiplexed.

2. The serial data transmission device according to claim 1, wherein the controller uniquely allocates data to be transmitted by the serial data transmission device to time slots to be time-division multiplexed, and causes the transmitter to transmit the data while maintaining signal allocation of data to be transmitted by the first other device.

3. The serial data transmission device according to claim 2, wherein the controller causes the transmitter to transmit identification information of the data allocated to the time slots through a low-speed control channel superimposed on a transmission path between the serial data transmission device and the first other device.

4. The serial data transmission device according to claim 3, wherein the controller revises assignment of the identification information of the data allocated to the transmitting-side time slots on a basis of assignment of the identification information received by the receiver and information of the data to be transmitted by the serial data transmission device.

5. The serial data transmission device according to claim 1, further comprising a clock adjusting circuit that increases a transmitting-side clock speed only in a case where a transmitting-side repetition period of the time slots to be time-division multiplexed is longer than a receiving-side repetition period.

6. The serial data transmission device according to claim 5, wherein the clock adjusting circuit increases a division ratio of a fractional PLL that generates a clock to control the transmitter on a basis of a value of a counter that is added at timing of a cycle of the time slots received by the receiver and is subtracted at timing of a cycle of the time slots transmitted by the transmitter.

7. The serial data transmission device according to claim 5, wherein the clock adjusting circuit implements a phase of precisely adjusting a clock to control the transmitter after a phase of increasing a speed of the clock to control the transmitter at a predetermined speed when a communication speed of the transmitter is increased.

8. The serial data transmission device according to claim 1, wherein in a case where a transmitting-side data transmission speed is lower than a receiving-side data transmission speed, the controller inserts invalid data and causes the transmitter to transmit the invalid data.

9. A clock recovery device comprising:
a receiver that receives data from another device; and
a clock recovery circuit that recovers a clock by means of a fractional PLL in accordance with reception of the data by the receiver,
wherein the clock recovery circuit calculates a division ratio of a frequency divider of the fractional PLL from a value obtained by computing a counter value of a first counter that counts up at timing of reception of data by the receiver and counts down at timing of a recovered clock, and
the clock recovery circuit controls the clock to be recovered by setting the division ratio of the frequency divider of the fractional PLL to a value obtained by performing an operation on the counter value of the first counter by a predetermined constant.

10. The clock recovery device according to claim 9, wherein the clock recovery circuit estimates a frequency of the clock to be recovered on a basis of a counter value of a second counter that counts a number of pieces of arrived data received by the receiver in a predetermined time.

11. The clock recovery device according to claim 9, wherein the clock recovery circuit controls the clock to be recovered by setting the division ratio of the frequency divider of the fractional PLL to a value obtained by causing the counter value of the first counter to pass through a low-pass filter and thereafter performing an operation on the counter value of the first counter by the predetermined constant.

* * * * *